United States Patent
Won et al.

(10) Patent No.: US 10,163,523 B2
(45) Date of Patent: Dec. 25, 2018

(54) SEMICONDUCTOR DEVICE AND OPERATING METHOD THEREOF

(71) Applicant: SK hynix Inc., Gyeonggi-do (KR)

(72) Inventors: Sam Kyu Won, Gyeonggi-do (KR); Myung Su Kim, Gyeonggi-do (KR); Jae Won Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/866,094

(22) Filed: Jan. 9, 2018

(65) Prior Publication Data

US 2018/0130544 A1    May 10, 2018

Related U.S. Application Data

(62) Division of application No. 14/953,194, filed on Nov. 27, 2015, now Pat. No. 9,899,102.

(30) Foreign Application Priority Data

Mar. 31, 2015  (KR) .................. 10-2015-0045296
Mar. 31, 2015  (KR) .................. 10-2015-0045305

(51) Int. Cl.
| | |
|---|---|
| G11C 29/04 | (2006.01) |
| G11C 29/02 | (2006.01) |
| G11C 29/12 | (2006.01) |
| G11C 29/50 | (2006.01) |
| G11C 16/28 | (2006.01) |
| G11C 16/34 | (2006.01) |

(52) U.S. Cl.
CPC ...... *G11C 29/025* (2013.01); *G11C 29/12005* (2013.01); *G11C 29/50004* (2013.01); *G11C 16/28* (2013.01); *G11C 16/349* (2013.01); *G11C 16/3459* (2013.01); *G11C 2029/1202* (2013.01)

(58) Field of Classification Search
CPC .............................. G11C 29/04; G11C 16/12
USPC ..................................... 365/185.12
See application file for complete search history.

(56) References Cited

U.S. PATENT DOCUMENTS

| | | | | |
|---|---|---|---|---|
| 7,558,109 B2* | 7/2009 | Brandman | ......... | G06F 11/1072 365/185.03 |
| 7,593,259 B2* | 9/2009 | Kim | ................ | G11C 11/5628 365/185.03 |
| 8,693,257 B2* | 4/2014 | Sridharan | .......... | G11C 11/5642 365/185.2 |

* cited by examiner

*Primary Examiner* — Hoai V Ho
*Assistant Examiner* — Muna A Techane
(74) *Attorney, Agent, or Firm* — IP & T Group LLP

(57) ABSTRACT

A method of operating a semiconductor memory device includes applying a program pulse at least once to each of a plurality of pages; performing a pre-read operation on a reference page among the plurality of pages through an initial test voltage; repeating the pre-read operation by controlling the initial test voltage until a result of the pre-read operation is a pass; setting the initial test voltage of when the result of the pre-read operation is the pass as a reference test voltage; and detecting a defective page among the plurality of pages by performing read operations on the plurality of pages through the reference test voltage.

12 Claims, 18 Drawing Sheets

SEMICONDUCTOR DEVICE AND OPERATING METHOD THEREOF

CROSS-REFERENCE TO RELATED APPLICATION

This application is a division of U.S. patent application Ser. No. 14/953,194 filed on Nov. 27, 2015, which claims priority to Korean patent application number 10-2015-0045296 filed on Mar. 31, 2015 and 10-2015-0045305, filed on Mar. 31, 2015. The disclosure of each of the foregoing applications is incorporated herein by reference in their entirety.

BACKGROUND

Field of Invention

Various exemplary embodiments relate generally to an electronic device, and more particularly, to a semiconductor device and an operating method thereof.

Description of Related Art

Semiconductor memory devices are made of semiconductors such as silicon (Si), germanium (Ge), gallium arsenide (GaAs), or indium phosphide (Inp). Semiconductor memory devices are classified into volatile memory devices and non-volatile memory devices.

Volatile memory devices lose stored data without a constant source of power. Examples of volatile memory devices include Static RAM (SRAM), Dynamic RAM (DRAM) and Synchronous DRAM (SDRAM). Non-volatile memory devices can retain stored data with or without a constant source of power. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories may be classified into NOR-type memories and NAND-type memories.

SUMMARY

Various embodiments are directed to a semiconductor memory device having improved reliability.

According to an embodiment, a method of operating a semiconductor memory device may include applying a program pulse at least once to each of a plurality of pages; performing a pre-read operation on a reference page among the plurality of pages through an initial test voltage; repeating the pre-read operation by controlling the initial test voltage until a result of the pre-read operation is a pass; setting the initial test voltage of when the result of the pre-read operation is the pass as a reference test voltage; and detecting a defective page among the plurality of pages by performing read operations on the plurality of pages through the reference test voltage.

According to another embodiment, a semiconductor memory device may include a memory cell array including a plurality of memory blocks, each of which includes a plurality of pages; and a peripheral circuit suitable for performing a pre-read operation on a reference page among the plurality of pages through an initial test voltage, wherein the peripheral circuit repeats the pre-read operation by controlling the initial test voltage until a result of the pre-read operation is a pass, and wherein the peripheral circuit further sets the initial test voltage of when the result of the pre-read operation is the pass as a reference test voltage, and detects a defective page among the plurality of pages by performing read operations on the plurality of pages through the reference test voltage.

According to another embodiment, a method of operating a semiconductor memory device including a plurality of pages coupled to a plurality of pages may include performing a program operation on each of the plurality of pages by using an incremental step pulse program (ISPP) method using a determined verify voltage; providing an additional program pulse at least once to the plurality of pages through a plurality of word lines; and detecting a defective page from the plurality of pages by performing read operations on the plurality of pages through a reference test voltage greater than the verify voltage by an amount of a determined voltage.

According to another embodiment, a semiconductor memory device may include a memory cell array including a plurality of memory blocks, each of which includes a plurality of pages coupled to each of the plurality of word lines; and a peripheral circuit suitable for performing a program operation on each of the plurality of pages, wherein during the program operation, the peripheral circuit performs a program operation on a selected page, verifies whether a result of the program operation is a pass by applying a verify voltage to a word line of the selected page, and repeats the program and verifying until the result of the program operation is the pass, and wherein the peripheral circuit further increases threshold voltages of memory cells included in the plurality of pages by applying an additional program pulse at least once to the plurality of word lines, and detects a defective page among the plurality of pages by performing read operations on the plurality of pages through a reference test voltage greater than the verify voltage by an amount of a determined voltage.

DETAILED DESCRIPTION

Figure 1:
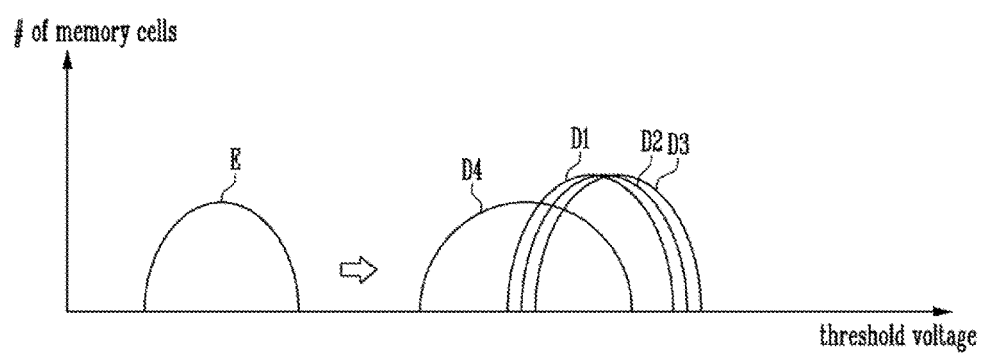
FIG. 1 is threshold voltage distributions illustrating memory cells included in each of a plurality of pages.

Hereinafter, various embodiments of the present disclosure will be described in detail with reference to the accompanying drawings. For simplicity, only what is for understanding operations of the present disclosure will be described below, and the rest will be omitted to avoid unnecessarily obscuring the subject matter. The present invention may be embodied is various other forms by those skilled in the art with reference to the detailed description below.

Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specified.

FIG. 1 is threshold voltage distributions illustrating memory cells included in each of a plurality of pages. In FIG. 1, the horizontal axis refers to a threshold voltage and the vertical axis refers to the number of memory cells.

On the assumption that a high-voltage program pulse is applied to each of a plurality of pages when memory cells of the plurality of pages have an erase state E, threshold voltages of the corresponding memory cells may be increased.

Most of the pages may include similar voltage distributions D1 to D3. For example, some of the plurality of pages may have a first voltage distribution D1, other pages may have a second voltage distribution D2, and yet other pages may have a third voltage distribution D3.

On the other hand, a predetermined page may have a relatively low voltage distribution D4. The corresponding memory cells in the predetermined page may be slow cells. The slow cells may have low threshold voltages even when the same program pulse is applied thereto. The slow cells may appear for various reasons. For example, due to a defect in a word line, the corresponding word line may not normally transfer the program pulse. For another example, a bridge may be formed between the corresponding word line and a word line adjacent thereto. The defects can be both process defects and defects that appear after fabrication.

Slow cells may reduce the reliability of the semiconductor memory device. During a program, slow cells may not have desired threshold voltages even when a program pulse is continuously applied thereto. As a result, the speed and reliability of the semiconductor memory device may be reduced due to the slow cells.

Figure 2:
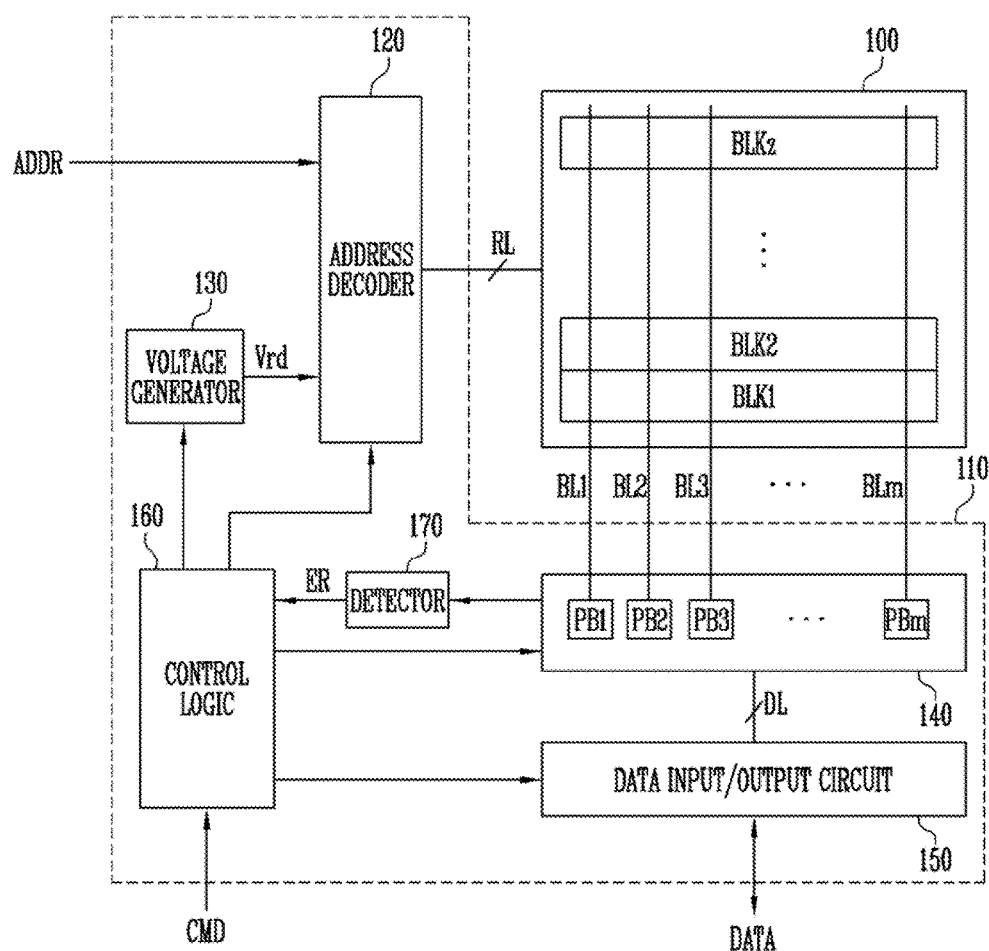
FIG. 2 is a block diagram illustrating a semiconductor memory device according to an embodiment.

FIG. 2 is a block diagram illustrating a semiconductor memory device 50 according to an embodiment.

Referring to FIG. 2, the semiconductor memory device 50 may include a memory cell array 100 and a peripheral circuit 110.

The memory cell array 100 may include a plurality of memory blocks BLK1 to BLKz. The memory blocks BLK1 to BLKz may be coupled to an address decoder 120 through row lines RL and to a read and write circuit 140 through bit lines BL1 to BLm. Each of the memory blocks BLK1 to BLKz may include a plurality of memory cells. According to an embodiment, the plurality of memory cells may be non-volatile memory cells.

The peripheral circuit 110 may include the address decoder 120, a voltage generator 130, the read and write circuit 140, a data input/output circuit 150, a control logic 160 and a detector 170.

The address decoder 120 may be coupled to the memory cell array 100 through the row lines RL. The address decoder 120 may be configured to operate in response to control of the control logic 160.

The address decoder 120 may receive an address ADDR. During a read, the address ADDR may include a block address and a row address.

The address decoder 120 may be configured to decode the block address from the received address ADDR. The address decoder 120 may select one of the memory blocks BLK1 to BLKz according to the decoded block address.

The address decoder 120 may be configured to decode the row address from the received address ADDR. The address decoder 120 may apply voltages provided from the voltage generator 130 to the row lines RL according to the decoded row address to select one word line in the selected memory block.

According to an embodiment, the address decoder 120 may include an address buffer, a block decoder and a row decoder.

The voltage generator 130 may be configured to generate a plurality of voltages by using an external power voltage supplied to the semiconductor memory device 50. The voltage generator 130 may operate in response to the control logic 160.

According to an embodiment, the voltage generator 130 may generate an internal power voltage by regulating the external power voltage. The internal power voltage generated by the voltage generator 130 may be used as an operating voltage of the semiconductor memory device 50.

According to an embodiment, the voltage generator 130 may generate a plurality of voltages by using the external power voltage or the internal power voltage. For example, the voltage generator 130 may include a plurality of pumping capacitors receiving the internal power voltage and generate a plurality of voltages by selectively activating the plurality of pumping capacitors in response to control of the control logic 160. The generated voltages may be applied to word lines by the address decoder 120.

The read and write circuit 140 may include first to mth page buffers PB1 to PBm. The first to mth page buffers PB1 to PBm may be coupled to the memory cell array 100 through the first to mth bit lines BL1 to BLm, respectively.

The first to mth page buffers PB1 to PBm may operate in response to control of the control logic 160.

The first to mth page buffers PB1 to PBm may communicate data DATA with the data input/output circuit 150. During a read, the first to mth page buffers PB1 to PBm may read data from memory cells coupled to the selected word line through the bit lines BL1 to BLm, respectively. The read data DATA may be output to the data input/output circuit 150 through data lines DL, or to the detector 170. During a program, the first to mth page buffers PB1 to PBm may receive the data DATA to be programmed from the data input/output circuit 150 through the data lines DL. The first to mth page buffers PB1 to PBm may program the memory cells coupled to the selected word line with the data DATA to be programmed through the bit lines BL1 to BLm, respectively.

According to an embodiment, the read and write circuit 140 may include a column selection circuit.

The data input/output circuit 150 may be coupled to the first to mth page buffers PB1 to PBm through the data lines DL. The data input/output circuit 150 may operate in response to control of the control logic 160. The data input/output circuit 150 may communicate the data DATA with an external device.

The control logic 160 may be coupled to the address decoder 120, the voltage generator 130, the read and write circuit 140, the data input/output circuit 150 and the detector 170. The control logic 160 may receive a command CMD. The control logic 160 may be configured to control the address decoder 120, the voltage generator 130, the read and write circuit 140, the data input/output circuit 150 and the detector 170 in response to the command CMD.

According to an embodiment, the control logic 160 may control the peripheral circuit 110 to perform a test operation. According to an embodiment, the control logic 160 may control the test operation in response to the command CMD. The test operation may include a pre-read operation performed to determine a reference test voltage and a plurality of read operations performed using the determined reference test voltage to detect a defective page. The control logic 160 may control the peripheral circuit 110 to perform the pre-read operation to a reference page of the selected memory block to determine the reference test voltage. Subsequently, the control logic 160 may control the peripheral circuit 110 to perform the plurality of read operations on the plurality of blocks of the selected memory block according to the reference test voltage to detect the defective page. This will be described in more detail with reference to FIG. 5.

The detector 170 may determine the number of fail bits in the data received from the first to mth page buffers PB1 to PBm and output the determined number of fail bits as an error value ER to the control logic 160. For example, a fail bit may be defined as a data bit having a logic value "1," and a pass bit may be defined as a data bit having a logic value "0." The control logic 160 may detect the defective page with reference to the received error value ER.

According to an embodiment, the control logic 160 may define a memory block including the defective page as a bad region. The bad region may be replaced by a redundancy memory block, among the plurality of memory blocks BLK1 to BLKz.

According to an embodiment, the control logic 160 may define a defective page as a bad region. The bad region may be replaced by a redundancy page, among pages included in the corresponding memory block.

According to an embodiment, the control logic 160 may store information about a defective page in an internal register (not illustrated). The information stored in the register may be externally provided in response to the command CMD.

Figure 3:
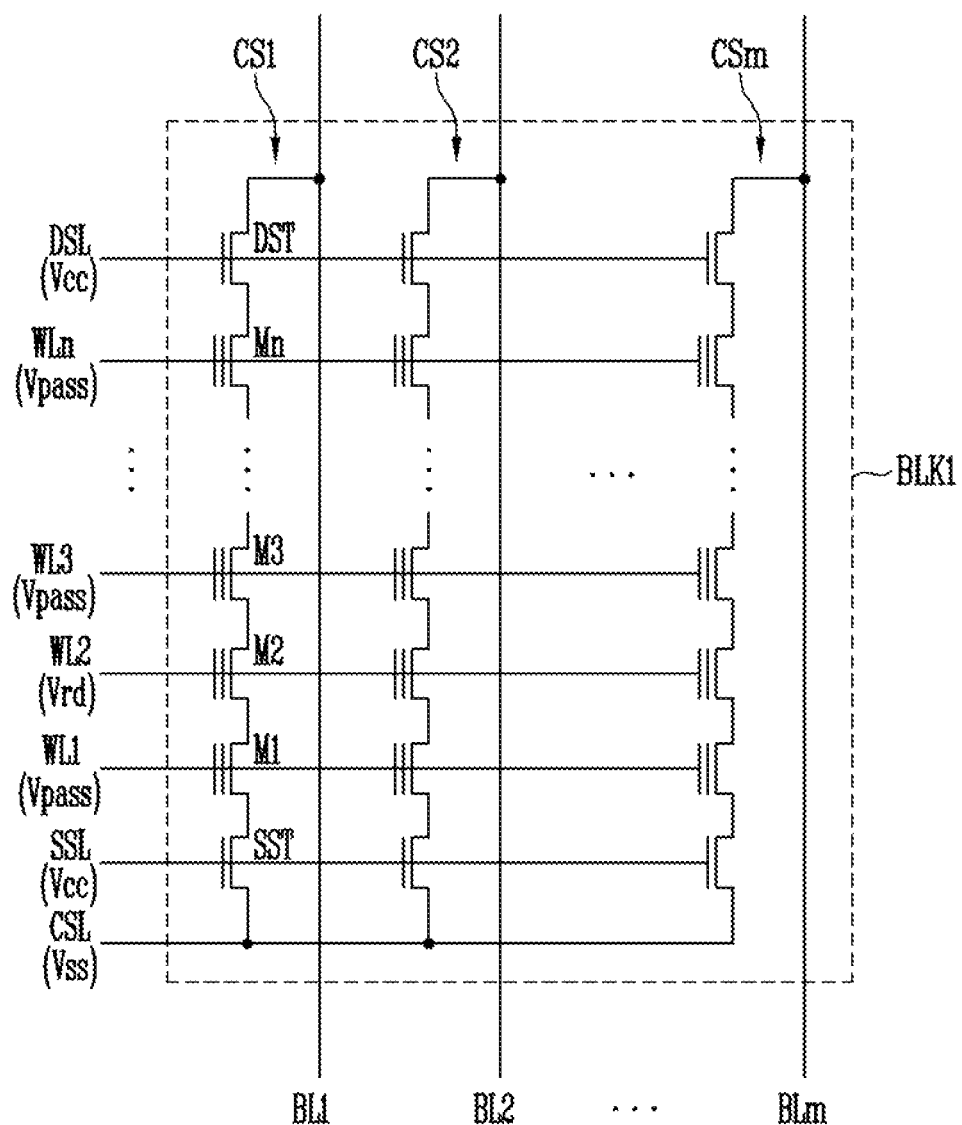
FIG. 3 is a circuit diagram exemplifying one of a plurality of memory blocks shown in FIG. 2.
Figure 4:
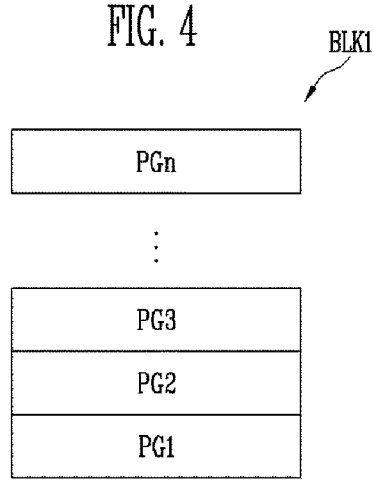
FIG. 4 is a schematic diagram illustrating pages included in a memory block shown in FIG. 2.

FIG. 3 is a circuit diagram exemplifying one (BLK1) of the plurality of memory blocks BLK1 to BLKz shown in FIG. 2. FIG. 4 is a schematic diagram illustrating pages PG1 to PGn included in the memory block BLK1 described with reference to FIG. 2.

Referring to FIGS. 2 and 3, the memory block BLK1 may include first to mth cell strings CS1 to CSm. The first to mth cell strings CS1 to CSm may be connected to the first to mth bit lines BL1 to BLm, respectively.

The cell strings CS1 to CSm may include source selection transistors SST, a plurality of memory cells M1 to Mn and drain selection transistors DST. The source selection transistors SST may be coupled to a source selection line SSL. The first to n-th memory cells M1 to Mn may be coupled to first to n-th word lines WL1 to WLn. The drain selection transistors DST may be coupled to a drain selection line DSL. Source sides of the source selection transistors SST may be coupled to a common source line CSL. Drain sides of the drain selection transistors DST may be coupled to the bit lines BL1 to BLm. The source selection line SSL, the first to n-th word lines WL1 to WLn and the drain selection line DSL may be included in the row lines RL described with reference to FIG. 2 and driven by the address decoder 120. The common source line CSL may be controlled by, for example, the control logic 160.

According to an embodiment, though not illustrated in FIG. 3, the memory block BLK1 may be further connected to at least one dummy word line and further include memory cells connected to at least one dummy word line. According to an embodiment, the memory block BLK1 may be coupled to two or more drain selection lines, and may include drain selection transistors coupled to the drain selection lines. In addition, the memory block BLK1 may be coupled to two or more source selection lines, and may include source selection transistors coupled to the source selection lines.

Memory cells coupled to a single word line may form a single page. Referring to FIG. 4, memory cells coupled to the first word line WL1 may form the first page PG1, memory cells coupled to the second word line WL2 may form the second page PG2, memory cells coupled to the third word line WL3 may form the third page PG3, and memory cells coupled to the nth word line WLn may form the nth page PGn. In other words, the memory block BLK1 may include n pages PG1 to PGn corresponding to the n word lines WL1 to WLn, respectively.

Referring again to FIG. 3, during the pre-read operation and the plural read operations, the first to mth bit lines BL1 to BLm may be charged. The common source line CSL may be maintained at a ground voltage. In addition, a power voltage may be applied to the source selection line SSL and the drain selection line DSL to turn on the source selection transistors SST and the drain selection transistors DST. A pass voltage Vpass having a high voltage level may be applied to unselected word lines (e.g., WL1 and WL3 to WLn). The corresponding memory cells may be turned on regardless of threshold voltages thereof. A read voltage Vrd may be applied to a selected word line (e.g., WL2). Selected memory cells (e.g., M2) may be turned on or off depending on whether threshold voltages thereof are greater than the read voltage Vrd. The first to mth page buffers PB1 to PBm may sense voltage variations or current variations of the first to mth bit lines BL1 to BLm to read page data of the selected memory cells. For example, memory cells having threshold voltages lower than the read voltage Vrd may be read as a logic value "1," and memory cells having threshold voltages greater than or equal to the read voltage Vrd may be read as a logic value "0." When the read voltage Vrd is controlled, page data read from the same memory cells may be changed. The page data may include as many data bits as the number of (m) selected memory cells.

Figure 5:
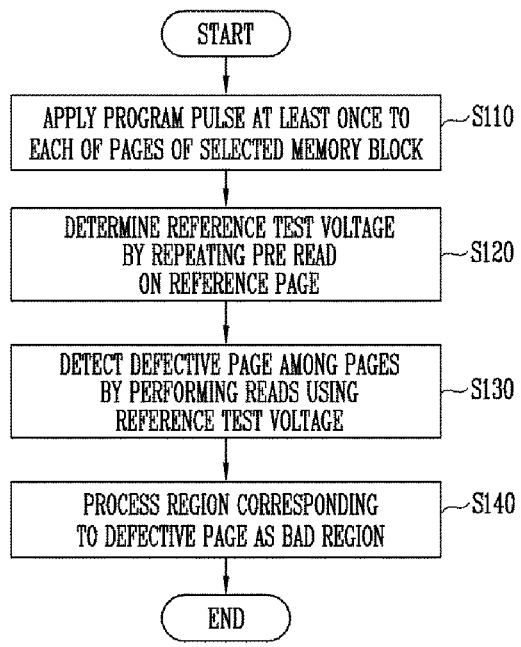
FIG. 5 is a flowchart illustrating a test operation of a semiconductor memory device according to an embodiment.

FIG. 5 is a flowchart illustrating the test operation of the semiconductor memory device 50 according to an embodiment.

Referring to FIGS. 2, 3 and 5, at step S110, a program pulse may be applied at least once to each of the pages PG1 to PGn of a selected memory block. The control logic 160 may select each of the memory blocks BLK1 to BLKz and perform the test operation on the selected memory block. Before the test operation is performed, memory cells of the selected memory block may have the erase state E as shown in FIG. 1. The control logic 160 may control the voltage generator 130 to generate the program pulse having a high voltage level. The generated program pulse may be transferred to the word lines WL1 to WLn of the selected memory block through the address decoder 120.

As the program pulse is applied, threshold voltages of the memory cells included in the pages PG1 to PGn may be increased. For example, each of the pages PG1 to PGn may include one of the first to third voltage distributions D1 to D3 as shown in FIG. 1. When one of the pages PG1 to PGn includes the slow cells, the corresponding page may include the fourth voltage distribution D4.

At step S120, a pre-read operation may be repetitively performed on a reference page to determine a reference test voltage. The control logic 160 may control the peripheral circuit 110 to repeat the pre-read operation to the reference page. The reference page may be one of the plurality of pages PG1 to PGn in the selected memory block as shown in FIG. 4. For example, the reference page may be determined by a predetermined row address. For example, the reference page may correspond to the first page PG1 of the selected memory block. For example, the reference page may be the last page PGn in the selected memory block. For example, the reference page may be one among the first to last pages PG1 to PGn in the selected memory block.

Each pre-read operation may be performed on the reference page by applying an initial test voltage as the read voltage Vrd. The control logic 160 may perform pre-read operations by controlling the initial test voltage in stages until a result of the pre-read operation is determined to be a pass. According to an embodiment, the control logic 160 may perform the pre-read operations by gradually reducing the initial test voltage.

At step S130, a defective page may be detected among the pages PG1 to PGn by performing read operations on the pages PG1 to PGn using the reference test voltage.

A read operation may be performed by applying the reference test voltage as the read voltage Vrd to each page. It may be determined whether a defective page exists in the pages PG1 to PGn on the basis of the read page data. By performing read operations on the pages sequentially in a direction from the first page PG1 to the nth page PGn, it may be determined whether the defective page exists in the first to n-th pages PG1 to PGn.

At step S140, a region corresponding to the defective page may be processed as a bad region. The control logic 160 may process a memory block including the defective page as the bad region. The control logic 160 may replace the memory block including the defective page with a redundancy memory block. When the memory block including the defective page is accessed, the corresponding redundancy memory block may be accessed.

Figure 6:
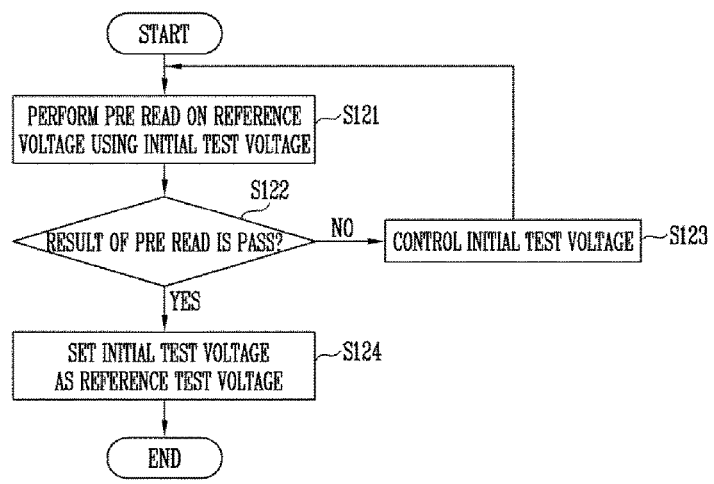
FIG. 6 is a flowchart illustrating step S120 of FIG. 5.

FIG. 6 is a flowchart illustrating step S120 described with reference to FIG. 5.

Referring to FIGS. 2 and 6, at step S121, the pre-read operation may be performed on the reference page by using the initial test voltage. The control logic 160 may control the voltage generator 130 to generate the initial test voltage. The control logic 160 may provide the address ADDR corresponding to the reference page to the address decoder 120. The initial test voltage from the voltage generator 130 may be applied to the reference page by the address decoder 120. When the initial test voltage is applied to the reference page, the first to mth page buffers PB1 to PBm may read page data from the reference page.

At step S122, it may be determined whether a result of the pre-read operation is a pass. The detector 170 may receive the page data from the first to mth page buffers PB1 to PBm and determine the number of fail bits in the page data. The detector 170 may transfer the determined number of fail bits to the control logic 160. According to an embodiment, the detector 170 may determine a data bit having the logic value "1" as a fail bit.

The control logic 160 may determine whether the result of the pre-read operation is a pass or a fail by comparing the number of fail bits with a critical value. When the number of fail bits is greater than or equal to the critical value, the control logic 160 may determine the result of the pre-read operation as a fail. When the number of fail bits is less than the critical value, the control logic 160 may determine that the result of the pre-read operation is a pass.

At step S123, the initial test voltage may be controlled. According to an embodiment, the control logic 160 may set the voltage generator 130 to decrease the initial test voltage by a predetermined voltage difference dV. Subsequently, steps S121 and S122 may be repeated until the control logic 160 determines that the result of the pre-read operation is a pass. Thus, pre-read operations may be performed while the initial test voltage is gradually decreased.

At step S124, the initial test voltage of when the result of the pre-read operation is determined as a pass may be set as the reference test voltage.

Figure 7:
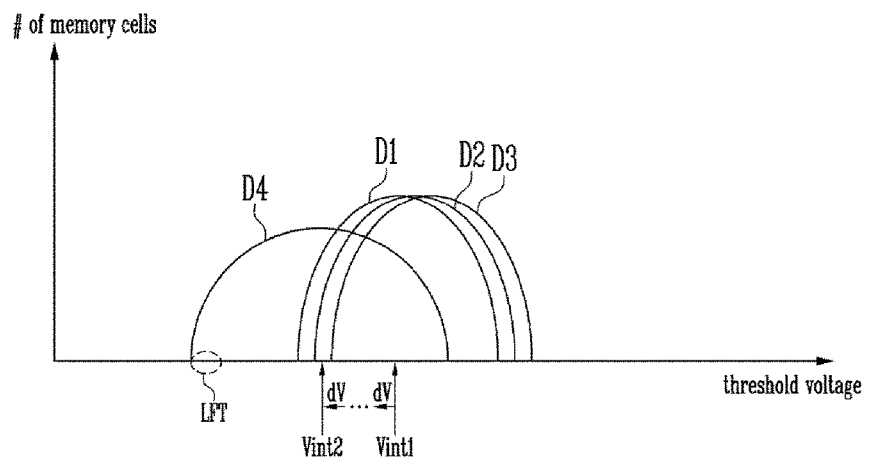
FIG. 7 is threshold voltage distributions illustrating an example of controlling an initial test voltage.

FIG. 7 is threshold voltage distributions illustrating an example of controlling the initial test voltage.

Referring to FIG. 7, it may be assumed that the reference page has the second voltage distribution D2. A predetermined default voltage may be set to a first initial test voltage Vint1. First, the pre-read operation may be performed using the first initial test voltage Vint1. A memory cell having a lower threshold voltage than the first initial test voltage Vint1 in the reference page may be read as the logic value "1." A memory cell having a threshold voltage greater than or equal to the first initial test voltage Vint1 in the reference page may be read as the logic value "0." When the number of data bits having the logic value "1" (i.e., fail bits) in the read page data is greater than the critical value, the pre-read operation may be performed using the initial test voltage decreased by a predetermined voltage difference dV. This pre-read operation may be repeated until the result of the pre-read operation is determined to be a pass. The first initial test voltage Vint1 may continue to decrease and reach a second initial test voltage Vint2. The pre-read operation may be performed using the second initial test voltage Vint2. When the number of fail bits in the read page data is less than the critical value, the second initial test voltage Vint2 may be set as the reference test voltage.

According to an embodiment, it may be additionally considered whether the second initial test voltage Vint2 is higher than a predetermined voltage. For example, on the assumption that a defective page is selected as the reference page and has the fourth voltage distribution D4, as the pre-read operation is repeated, the first initial test voltage Vint1 may decrease to a voltage level adjacent to a left tail LFT in a voltage range of the fourth voltage distribution D4. When the corresponding initial test voltage adjacent to a left tail LFT is set to the reference test voltage, subsequent detection of the defective page may lose its reliability. Therefore, it may be additionally considered whether the second initial test voltage Vint2 is higher than the predetermined voltage adjacent to the left tail of the first to third voltage distributions D1 to D3.

The voltage distributions D1 to D3 may be changed by process characteristics of the semiconductor memory device 50. The voltage distributions D1 to D3 according to each memory block may be varied due to process errors of the semiconductor memory device 50. As the program/erase cycle of the semiconductor memory device 50 increases, a memory block on which programs and erases are frequently performed may have, for example, higher voltage distributions than a memory block on which less programs and erases have been performed.

According to an embodiment, as the pre-read operation is repeated by controlling the initial test voltage, the reference test voltage may be set to a voltage level adjacent to a left tail of the voltage distributions D1 to D3 of normal pages. In other words, the reference test voltage may be set adaptively based on characteristics of pages of the corresponding memory block. Therefore, subsequent detection of a defective page using the reference test voltage may be efficiently performed. Accordingly, the semiconductor memory device 50 having improved reliability may be provided.

Figure 8:
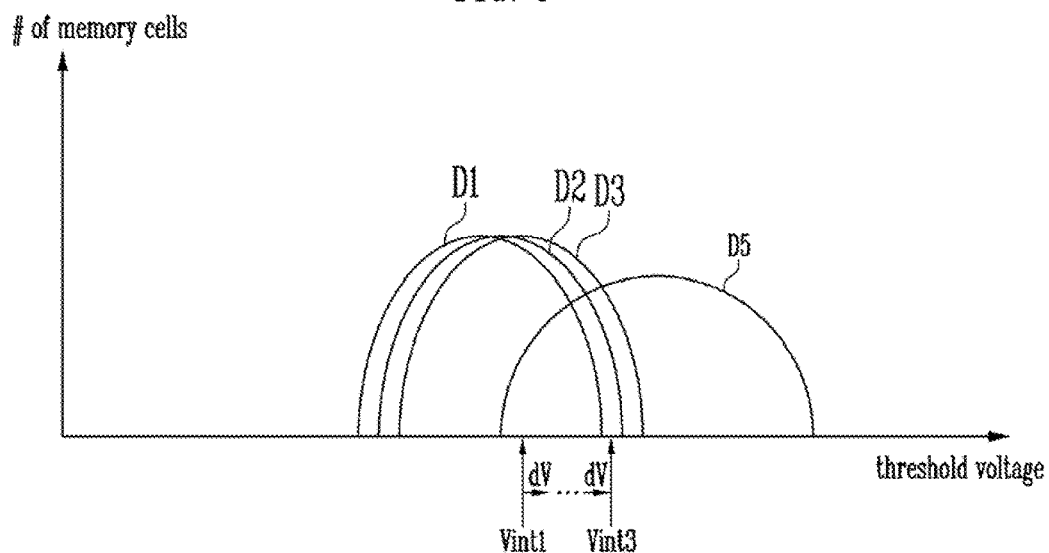
FIG. 8 is threshold voltage distributions illustrating memory cells included in each of a plurality of pages.

FIG. 8 is threshold voltage distributions illustrating memory cells included in each of a plurality of pages. In FIG. 8, the horizontal axis refers to a threshold voltage, and the vertical axis refers to the number of memory cells.

Referring to FIG. 8, when the program pulse having a high voltage level is applied to memory cells having the erase state E as shown in FIG. 1, some page may have a high voltage distribution D5. The corresponding memory cells may be fast cells, and the fast cells may have high threshold voltages even when the same program pulse is applied thereto. The fifth voltage distribution D5 may have a higher voltage level than the voltage distributions D1 to D3 of the normal pages. It may be understood that fast cells may be generated for various reasons. For example, due to process errors of the semiconductor memory device, the corresponding memory cells may be sensitively affected by the program pulse.

The fast cells may reduce the reliability of the semiconductor memory device. During a program, even when program pulses are applied a small number of times, the fast cells may have excessively increased threshold voltages. The excessively increased threshold voltages may reduce read margin.

The reference test voltage may be set to detect a page including the fast cells as the defective page. It may be assumed that the reference page has the second voltage distribution D2. The predetermined default voltage may be set to the first initial test voltage Vint1. A pre-read operation may be performed using the first initial test voltage Vint1. A memory cell having a lower threshold voltage than the first initial test voltage Vint1 in the reference page may be read as the logic value "1." A memory cell having a threshold voltage greater than or equal to the first initial test voltage Vint1 in the reference page may be read as the logic value "0."

According to this embodiment, a data bit having the logic value "0" may be defined as a fail bit, and a data bit having the logic value "1" may be defined as a pass bit. When data bits having the logic value "0" (i.e., fail bits) in the read page data are greater than the critical value, the pre-read operation may be performed using the initial test voltage increased by the predetermined voltage difference dV. The first initial test voltage Vint1 may continue to increase and reach a third initial test voltage Vint3. The pre-read operation may be performed using the third initial test voltage Vint3. When the number of fail bits in the read page data is less than the critical value, the third initial test voltage Vint3 may be set as the reference test voltage. In other words, the initial test voltage of when the result of the pre-read operation is a pass may be defined as the reference test voltage.

According to an embodiment, considering that the reference page may be a defective page having the fifth voltage distribution D5, it may be further determined whether the third initial test voltage Vint3 is lower than the predetermined voltage. For example, it may be additionally considered whether the third initial test voltage Vint3 is lower than the predetermined voltage adjacent to the right tail of the first to third voltage distributions D1 to D3.

Subsequently, the plural read operations may be performed on pages of the selected memory block by using the reference test voltage. During each of the read operations, in the page data or comparative data, which will be described with reference to FIGS. 10 and 12, a data bit having the logic value "0" may be defined as a fail bit, and a data bit having the logic value "1" may be defined as a pass bit.

Figure 9:
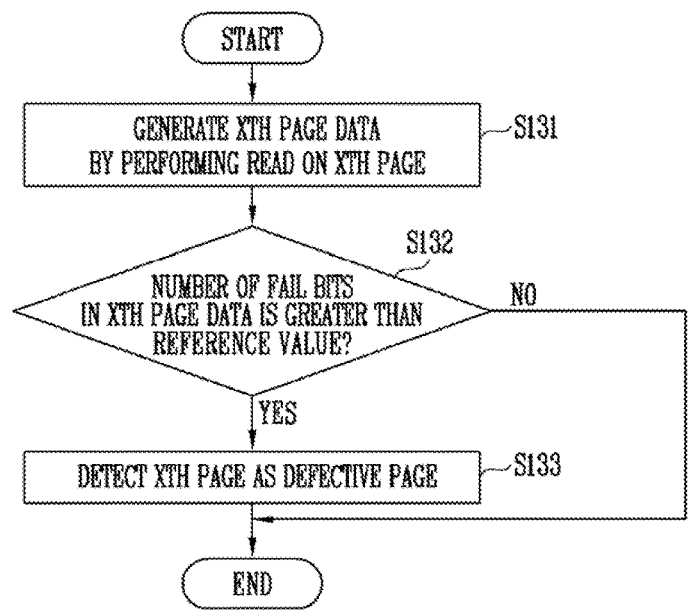
FIG. 9 is a flowchart illustrating an example of step S130 of FIG. 5.

FIG. 9 is a flowchart illustrating an example of step S130 described with reference to FIG. 5.

Referring to FIGS. 4 and 9, at step S131, a read operation may be performed on an xth page PGx to generate xth page data, where x is a natural number less than or equal to n. Data of memory cells of the xth page PGx may be read by applying the reference test voltage to an xth word line WLx. The read xth page data may be stored in the first to mth page buffers PB1 to PBm described with reference to FIG. 2.

At step S132, it may be determined whether the number of fail bits in the xth page data is greater than a reference value. The number of data bits having the logic value "1" (i.e., fail bits) may be determined among data bits of the xth page data. The xth page data may be provided to the detector 170 from the first to mth page buffers PB1 to PBm. The detector 170 may determine the number of fail bits included in the xth page data. A result of determination may be transferred as the error value ER to the control logic 160 as described with reference to FIG. 2.

According to another example, when a defective page corresponding to the fifth voltage distribution D5 described with reference to FIG. 8 is detected, the number of data bits having the logic value "0" (i.e., fail bits) may be determined among the data bits of the xth page data. The detector 170 may receive the xth page data from the first to mth page buffers PB1 to PBm and determine the number of data bits having the logic value "0" in the xth page data.

At step S133, when the error value ER is greater than a reference value, the xth page may be determined as the defective page. The reference value may be set beforehand. When the error value ER is less than or equal to the reference value, it may mean that threshold voltages of the memory cells of the xth page are normally increased during the program operation. On the other hand, when the error value ER is greater than the reference value, it may mean that the threshold voltages of the memory cells of the xth page are not properly increased during the program operation. When the threshold voltages of the corresponding memory cells are not properly increased, it may mean that the program pulse is not normally transferred to the corresponding memory cells due to a defect in the xth word line WLx.

According to another example, when the defective page corresponding to the fifth voltage distribution D5 described with reference to FIG. 8 is detected, the reference value may be set to a different value from when the defective page corresponding to the fourth voltage distribution D4 described with reference to FIG. 7. When the error value ER is less than or equal to the reference value, it may mean that the threshold voltages of the memory cells of the xth page are normally increased during the program operation. When the error value E is greater than the reference value, the threshold voltages of the memory cells of the xth page may be excessively increased during the program operation. When the threshold voltages of the corresponding memory cells are excessively increased, it may be understood that the memory cells are sensitive to the program pulse due to process errors of the semiconductor memory device.

Subsequently, the memory block including the defective page may be processed as the bad region. The bad region may be replaced by the redundancy memory block among the plurality of memory blocks BLK1 to BLKz. When data corresponding to the bad region is received from an external device, the corresponding data may be addressed to the redundancy memory block.

According to the embodiment in FIG. 9, the defective page may be detected at a high operation speed.

Figure 10:
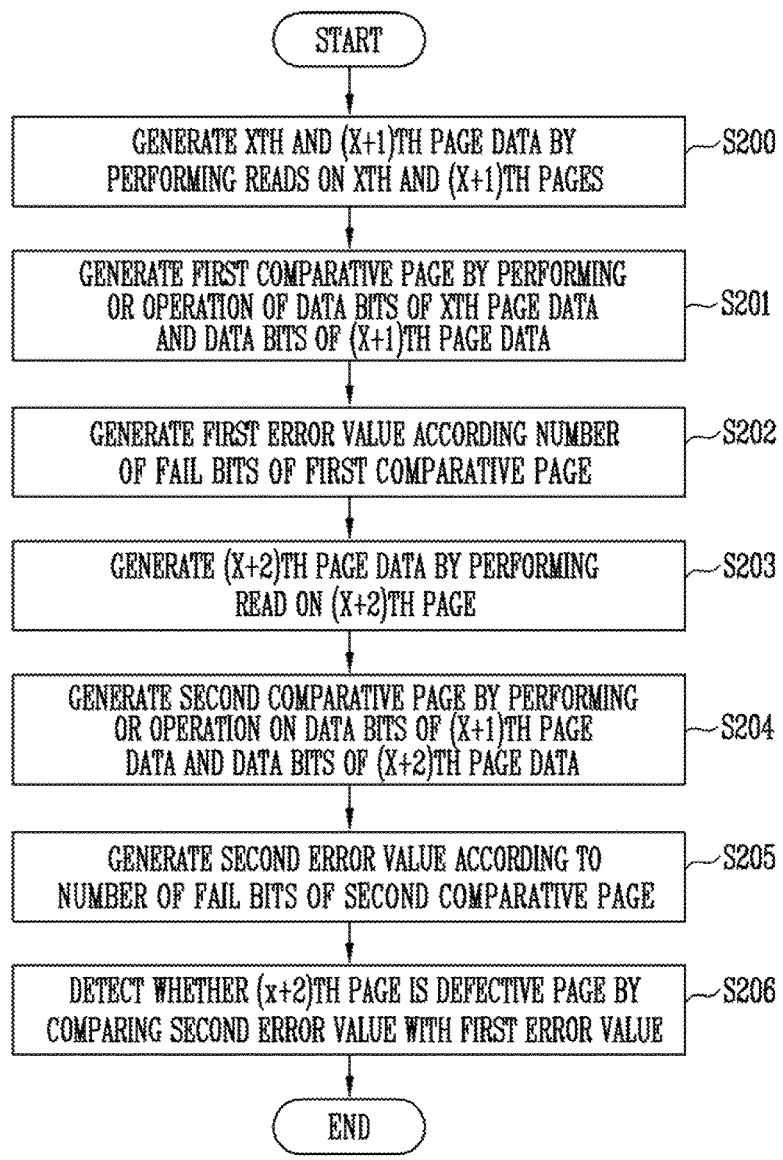
FIG. 10 is a flowchart illustrating another example of step S130 of FIG. 5.

FIG. 10 is a flowchart illustrating another example of step S130 described with reference to FIG. 5.

Referring to FIGS. 4 and 10, at step S200, the read operations may be performed on the xth page PGx and an (x+1)th page PGx+1 to generate xth and (x+1)th page data, respectively, where x is a natural number less than or equal to n.

At step S201, an OR operation may be performed on data bits of the xth and (x+1)th page data to generate a first comparative page. Each of the data bits of the first comparative page may have the logic value "1" when at least one of the corresponding data bits of the xth and (x+1)th page data has the logic value "1" (i.e., fail bit).

According to another embodiment, when the defective page corresponding to the fifth voltage distribution D5 described with reference to FIG. 8 is detected, an AND operation may be performed on the data bits of the xth and (x+1)th page data. Each of the data bits obtained by the AND operation may have the logic value "0" when at least one of the corresponding data bits of the xth and (x+1)th page data has the logic value "0" (i.e., fail bit).

At step S202, the number of fail bits of the first comparative page may be determined, and a first error value may be generated according to the determined number of fail bits. The detector 170 may receive the first comparative page and determine the number of fail bits included in the first comparative page. The determined number of fail bits may be transferred as the first error value ER to the control logic 160 as described with reference to FIG. 2.

At step S203, a read may be performed on a subsequent (i.e., (x+2)th) page to generate (x+2)th page data.

At step S204, an OR operation may be performed on data bits of the (x+1)th and (x+2)th page data to generate a second comparative page. Each of the data bits of the second comparative page may have the logic value "1" when at least one of the corresponding data bits of the (x+1)th and (x+2)th page data has the logic value "1" (i.e., fail bit).

According to another embodiment, when the defective page corresponding to the fifth voltage distribution D5 described with reference to FIG. 8 is detected, an AND operation may be performed on the data bits of the (x+1)th page and (x+2)th data. A data bit having the logic value "0," among the operated data bits, may be a fail bit.

At step S205, the number of fail bits of the second comparative page may be determined, and a second error value may be generated according to the determined number of fail bits. The detector 170 may receive the second comparative page and transfer the number of fail bits within a logic value in the second comparative page as the second error value ER to the control logic 160 as described with reference to FIG. 2.

At step S206, the second error value may be compared with the first error value to detect whether the (x+2)th page is a defective page.

According to an embodiment, the control logic 160 may calculate an average value by dividing each error value by 2. It may be understood that the calculated average value refers to an average value of the number of fail bits of the two corresponding page data. A first average value corresponding to the first error value may refer to an average value of the number of fail bits included in the xth and (x+1)th page data. A second average value corresponding to the second error value may refer to an average value of the number of fail bits included in the (x+1)th and (x+2)th page data. Subsequently, the control logic 160 may determine whether the (x+2)th page is the defective page by comparing the second average value with the first average value. According to an embodiment, when the second average value is greater than a multiple integer (e.g., four times) of the first average value, the (x+2)th page may be determined as the defective page.

Therefore, a defective page may be detected on the basis of a change rate of the pages, which are consecutively arranged in a single memory block, depending on the number of fail bits of the pages. More specifically, when the current page (e.g., (X+2)th page) includes many more fail bits than the previous page (e.g., (X+1)th page), the current page may be determined as the defective page. When the current page includes slightly more fail bits than the previous page, the current page may not be determined to be a defective page. When the current page includes many more fail bits than the previous page, it may mean that memory cells of the current page do not normally react to the program pulse. For example, a word line corresponding to the current page is likely to be a defective word line. According to an embodiment, the current page may be determined as the defective page on the basis of the change rate of the consecutively arranged pages with respect to the number of fail bits, so that undesirable generation of a bad region may be prevented.

The characteristics of the first page PG1 and the characteristics of the nth page PGn in the memory block may be different. For example, since the nth page PGn is more distant from the read and write circuit 140 than the first page PG1, even when the number of electrons captured in the memory cell of the first page PG1 is equal to the number of electrons captured in the memory cell of the nth page PGn, a threshold voltage of the nth page PGn may be read to be higher than that of the first page PG1. For example, this phenomenon may be affected by a length of the bit lines BL1 to BLm between the respective pages and the read and write circuit 140. According to the example described with reference to FIG. 10, even when the first page PG1 is determined to include slightly more fail bits than the reference value, the first page PG1 may not be determined as to be a defective page. Further, even when the nth page PGn is determined to include slightly more fail bits than the reference value, the nth page PGn may be determined to be a defective page. As a result, erroneous determination of bad regions may be prevented.

Figure 11:
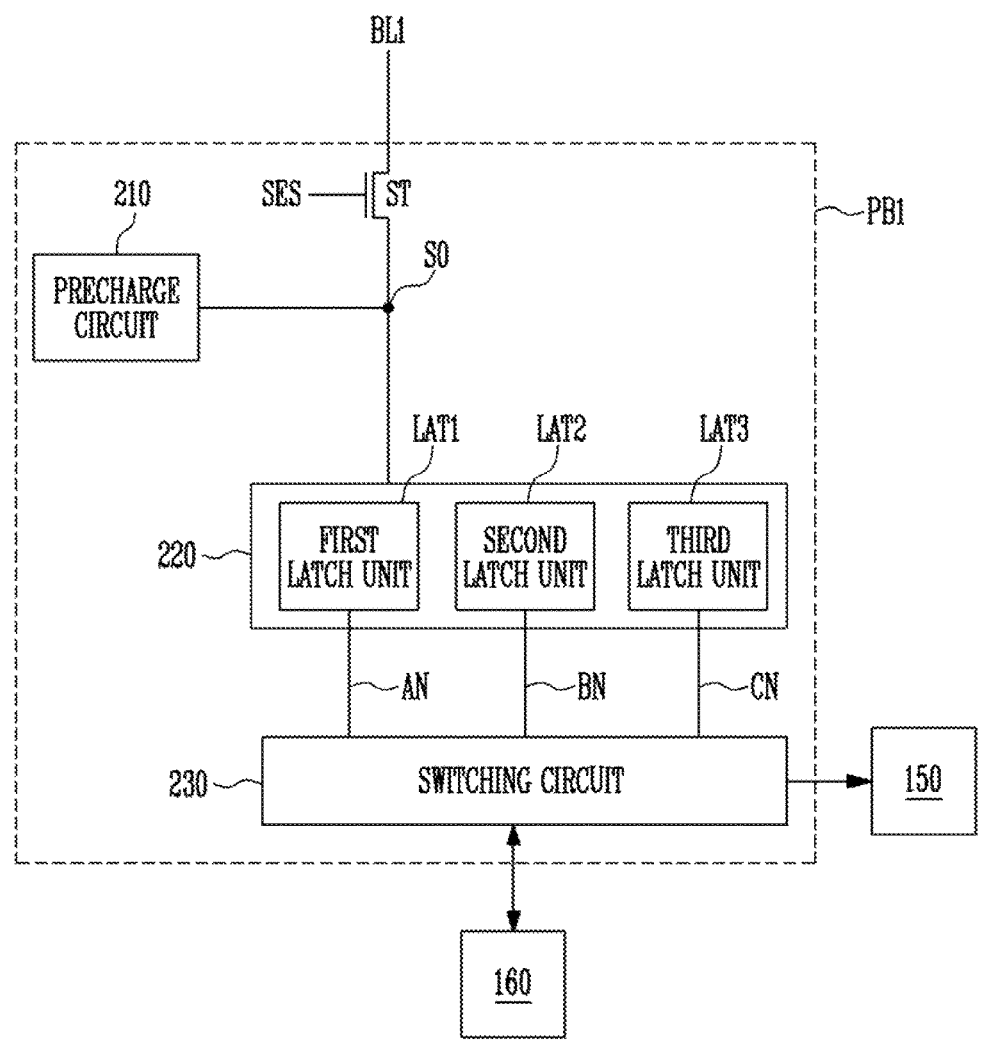
FIG. 11 is a block diagram illustrating one of the page buffers shown in FIG. 2.

FIG. 11 is a block diagram illustrating one (PB1) of the page buffers PB1 to PBm shown in FIG. 2.

Referring to FIG. 11, the first page buffer PB1 may include a sensing transistor ST, a precharge circuit 210, a latch circuit 220 and a switching circuit 230.

The sensing transistor ST may be connected between the first bit line BL1 and a sense node SO. The sensing transistor ST may be turned on in response to a sensing signal SES from the control logic 160 as shown in FIG. 2.

The precharge circuit 210 may be connected to the sense node SO and the first bit line BL1 through the sensing transistor ST. The precharge circuit 210 may precharge the first bit line BL1 through the sensing transistor ST in response to control of the control logic 160.

The latch circuit 220 may be connected to the sense node SO. The latch circuit 220 may include a plurality of latch units LAT1 to LAT3. Each of the first to third latch units LAT1 to LAT3 may include a single data bit. Data read from the memory cell through the first bit line BL1 may be stored in the first latch unit LAT1. The first to third latch units LAT1 to LAT3 may exchange data in response to control of the control logic 160.

The first, second and third latch units LAT1, LAT2 and LAT3 may be coupled to the switching circuit 230 through first, second and third nodes AN, BN and CN, respectively. The first to third latch units LAT1 to LAT3 may be coupled to the data input/output circuit 150 and the detector 170 through the switching circuit 230.

The latch circuit 220 may further include other transistors (not illustrated) in addition to the latch units LAT1 to LAT3. It may be understood that an OR operation or an AND operation may be performed on data bits stored in the first to third latch units LAT1 to LAT3 by using these additional transistors. The first and second comparative pages described with reference to FIG. 10 may be generated in the page buffers PB1 to PBm.

Figure 12:
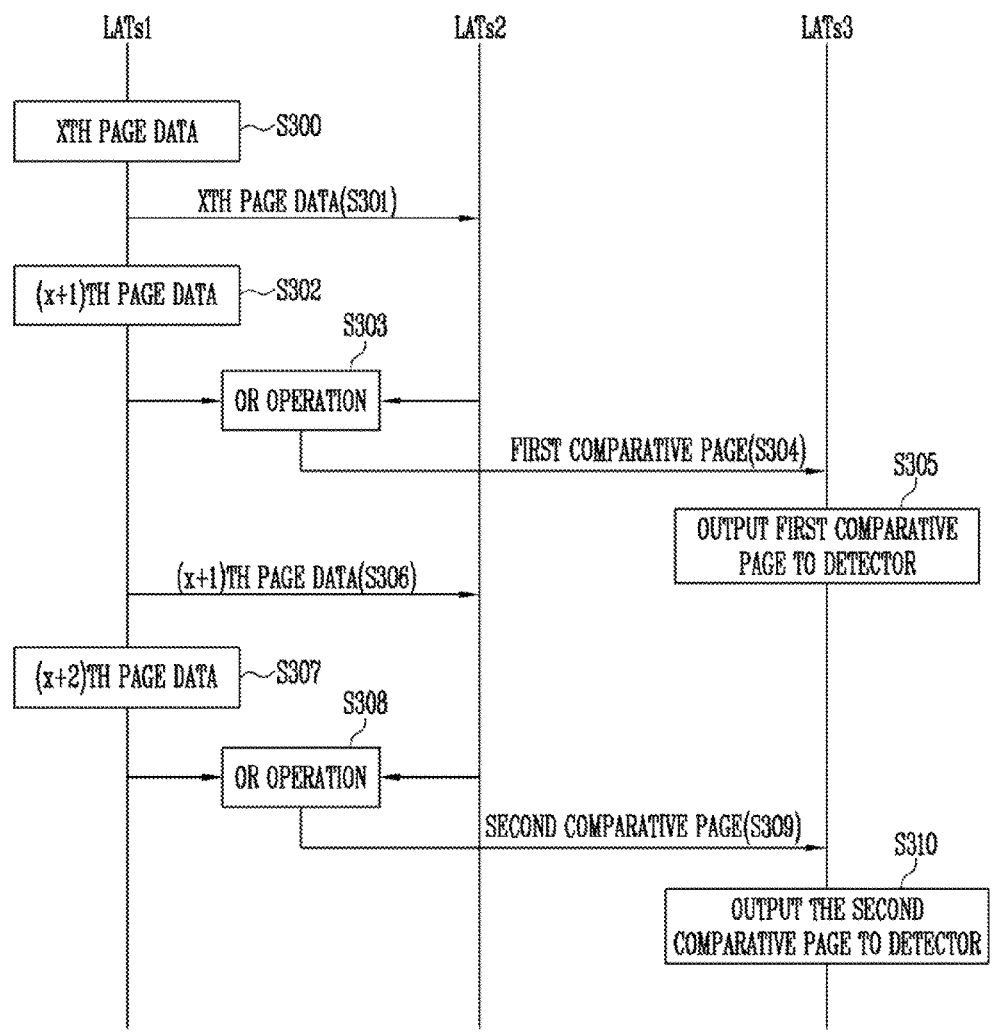
FIG. 12 is a transaction flow illustrating an operation of page buffers shown in FIGS. 10 and 11.

FIG. 12 is a transaction flow illustrating an operation of the page buffers PB1 to PBm described with reference to FIGS. 10 and 11. FIG. 12 exemplarily shows the page buffers PB1 to PBm performing steps S200, S201, S203 and S204 for generating the first and second comparative pages described with reference to FIGS. 10 and 11.

Referring to FIGS. 2 and 10 to 12, at step S300, the xth page data may be read by first latches LATs1 of the page buffers PB1 to PBm by performing a read operation on the xth page. At step S301, the xth page data may be transferred from the first latches LATs1 to second latches LATs2 of the page buffers PB1 to PBm. For example, data stored in the first latch LAT1 in each page buffer may be transferred to the second latch LAT2 through the sense node SO.

At step S302, the (x+1)th page data may be read by the first latches LATs1 by performing a read operation on the (x+1)th page.

At step S303, an OR operation may be performed on the (x+1)th page data stored in the first latches LATs1 and the xth page data stored in the second latches LATs2. At step S304, the first comparative page may be stored in third latches LATs3 of the page buffers PB1 to PBm.

At step S305, the first comparative page may be output from the third latches LATs3 to the detector 170. The detector 170 may detect the number of fail bits in the first comparative page.

At step S306, the (x+1)th page data remaining in the first latches LATs1 may be transferred to the second latches LATs2. Subsequently, at step S307, the (x+2)th page data may be read by the first latches LATs1 by performing a read operation on the (x+2)th page.

At step S308, an OR operation may be performed on the (x+2)th page data stored in the first latches LATs1 and the (x+1)th page data stored in the second latches LATs2. At step S309, the second comparative page generated by performing the OR operation may be stored in the third latches LATs3.

At step S310, the second comparative page may be output to the detector 170 from the third latches LATs3. The detector 170 may detect the number of fail bits in the second comparative page.

According to the embodiment in FIG. 12, a comparative page may be generated by using the plurality of latches LATs1, LATs2, and LATs3 in the page buffers PB1 to PBm without a separate configuration for storing the comparative page in the semiconductor memory device 50. Therefore, the area of the semiconductor memory device 50 may be reduced.

Figure 13:
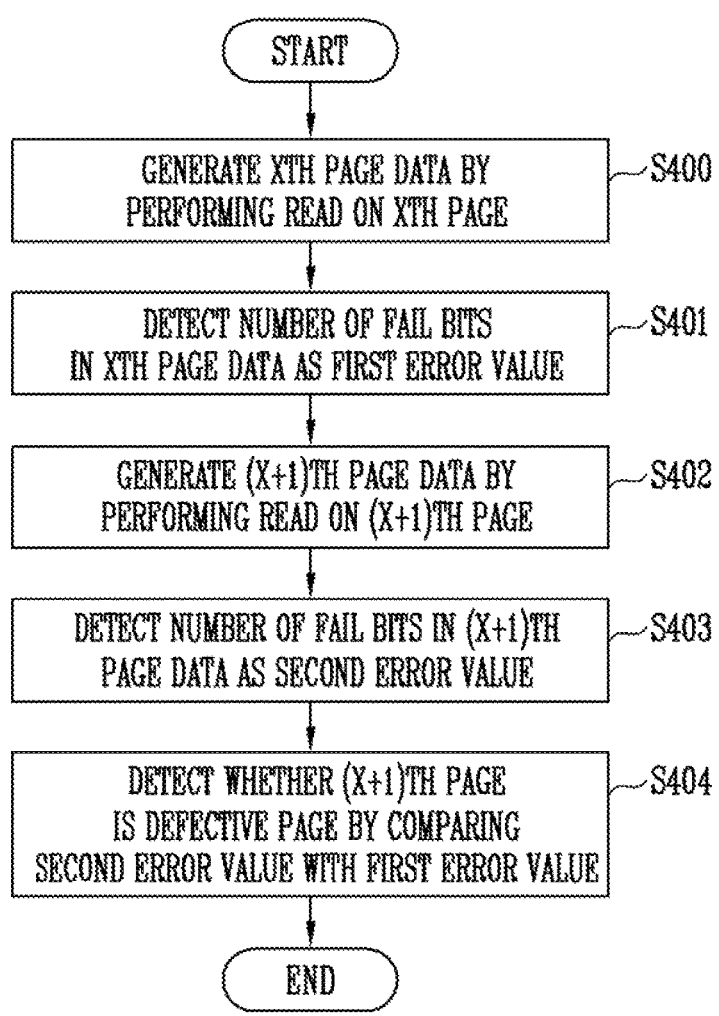
FIG. 13 is a flowchart illustrating another example of step S130 of FIG. 5.

FIG. 13 is a flowchart illustrating another example of step S130 described with reference to FIG. 5.

Referring to FIGS. 2 and 13, at step S400, a read operation may be performed on the xth page PGx to generate the xth page data. The xth page data may be provided from the page buffers PB1 to PBm to the detector 170.

At step S401, the number of fail bits in the xth page data may be detected as a first error value. The detector 17 may detect the number of fail bits in the xth page data and transfer the detected number of fail bits as the first error value ER to the control logic 160.

At step S402, the (x+1)th page PGx+1 may be read to generate the (x+1)th page data. The (x+1)th page data may be provided from the page buffers PB1 to PBm to the detector 170.

At step S403, the number of fail bits in the (x+1)th page data may be detected as a second error value. The detector 170 may transfer the number of fail bits in the (x+1)th page data as the second error value ER to the control logic 160.

At step S404, it may be determined whether the (x+1)th page is the defective page by comparing the second error value with the first error value. According to an embodiment, the control logic 160 may determine that the (x+1)th page is the defective page when the second error value is greater than a multiple integer (e.g., four times) of the first error value. Therefore, the defective page may be detected on the basis of a change rate of pages arranged consecutively in a single memory block with respect to the number of fail bits.

Figure 14:
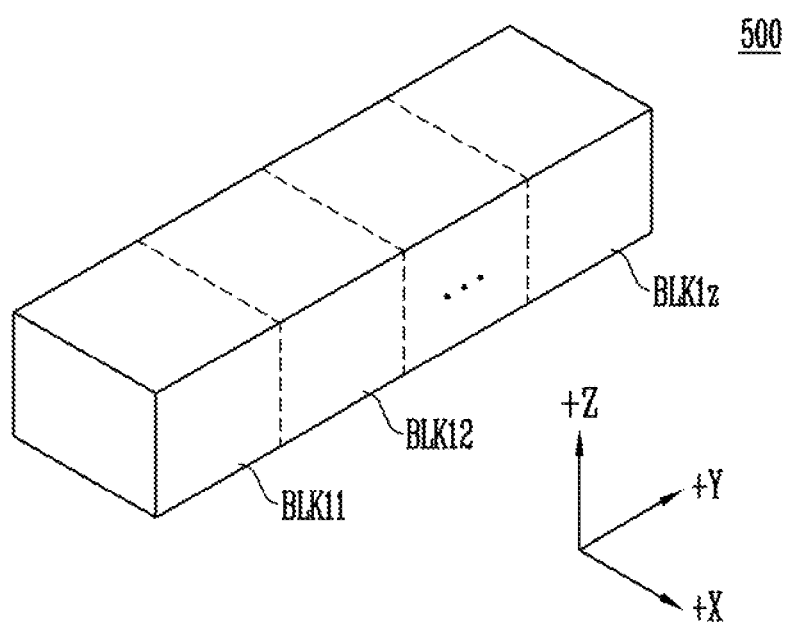
FIG. 14 is a block diagram illustrating a memory cell array shown in FIG. 1.

FIG. 14 is a block diagram illustrating a memory cell array 500 described with reference to FIG. 1.

Referring to FIG. 14, a memory cell array 500 may include a plurality of memory blocks BLK11 to BLK1z. Each of the memory blocks BLK11 to BLK1z may have a three-dimensional structure. Each memory block may include a plurality of memory cells stacked over the substrate. The memory cells may be arranged in +X direction, +Y direction and +Z direction. The structure of each of the memory blocks will be described below in detail with reference to FIGS. 5 and 15.

Figure 15:
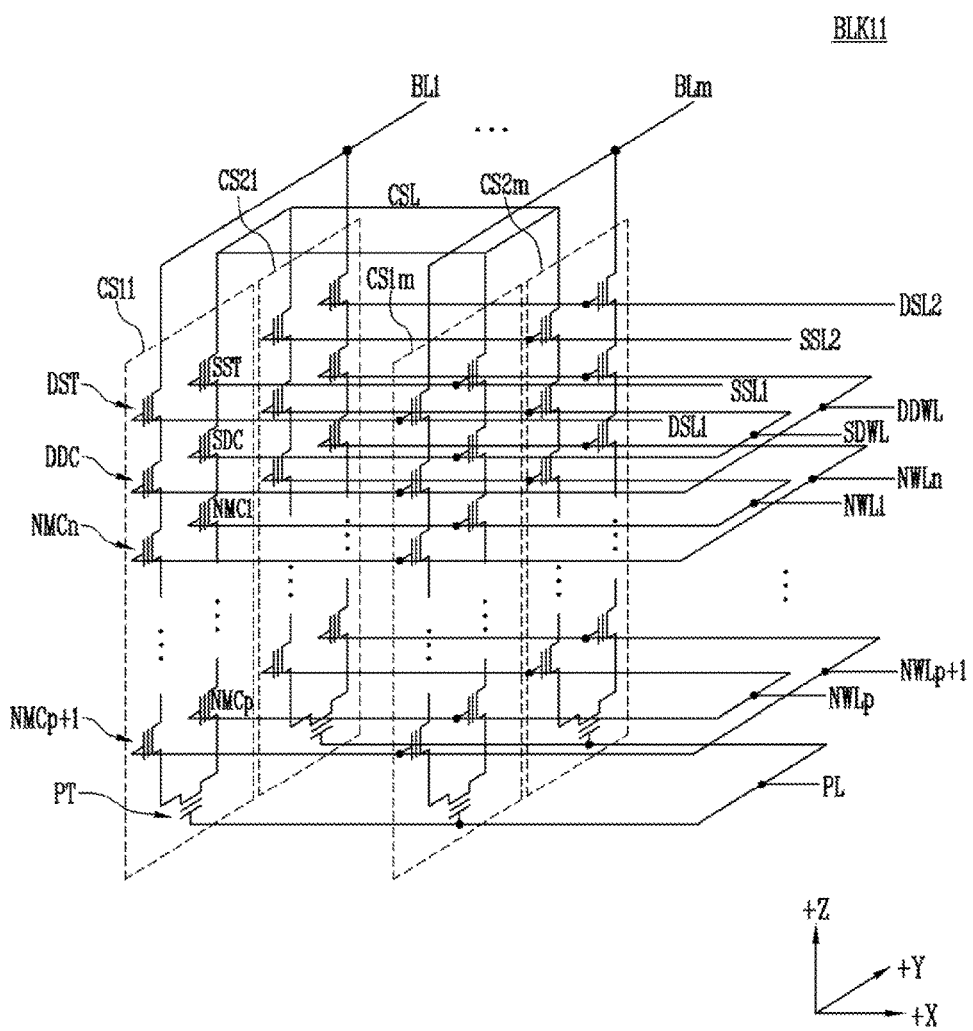
FIG. 15 is a circuit diagram illustrating an example of one of the memory blocks shown in FIG. 14.

FIG. 15 is a circuit diagram illustrating an example of one (BLK11) of the memory blocks BLK11 to BLK1z shown in FIG. 14.

Referring to FIG. 15, the first memory block BLK11 may include a plurality of cell strings CS11 to CS1m and CS21 to CS2m. Each of the cell strings CS11 to CS1m and CS21 to CS2m may have a 'U' shape. In the first memory block BLK11, m cell strings may be arranged in a row direction (i.e., +X direction). For simplicity, FIG. 15 illustrates the first memory block BLK11 including two cell strings arranged in a column direction. However, two or more cell strings may be arranged in the column direction (i.e., +Y direction).

Each of the cell strings CS11 to CS1m and CS21 to CS2m may include at least one source selection transistor SST, at least one source side dummy memory cell SDC, a plurality of memory cells NMC1 to NMCn, a pipe transistor PT, at least one drain side dummy memory cell DDC, and at least one drain selection transistor DST.

The selection transistors SST and DST, the dummy memory cells SDC and DDC and the memory cells NMC1 to NMCn may have similar structures. According to an embodiment, each of the selection transistors SST and DST, the dummy memory cells SDC and DDC and the memory cells NMC1 to NMCn may include a channel layer, a tunneling insulating layer, a charge storage layer and a blocking insulating layer.

In each cell string, memory cells NMC1 to NMCp, the source side dummy memory cell SDC and the source selection transistor SST may be sequentially stacked in a direction crossing a substrate (not illustrated) under the memory block BLK11, i.e., +Z direction. In each cell string, memory cells NMCp+1 to NMCn, the drain side dummy memory cell DDC and the drain selection transistor DST may be sequentially stacked in the +Z direction.

Two holes may pass through structures, disposed between the bit lines BL1 to BLm and the substrate (not illustrated) under the memory block BLK11, in the opposite direction to the +Z direction. A channel layer may be formed in each of the holes. Two holes may correspond to a single cell string. The channel layer of each of the holes may be coupled to the channel layer of the pipe transistor PT. The channel layer of each of the holes may be provided as channel layers of the selection transistors SST and DST, the dummy memory cells SDC and DDC and the memory cells NMC1 to NMCn included in a single cell string.

As is well known in the art, the width of each hole may gradually decrease towards the substrate due to process characteristics. For example, the structures of the memory block BLK11 may be etched from top toward the substrate to form holes, so that the width of each of the holes may gradually decrease toward the substrate. When a channel layer is formed in the hole, the channel layer corresponding to each of the memory cells NMC1 to NMCn in the cell string may have a diameter corresponding to the width of the hole. Therefore, the memory cells NMC1 to NMCn according to each word line may have different channel layers, and the memory cells NMC1 to NMCn may have different characteristics. In addition, it may be understood that the memory cells NMC1 to NMCn may have different characteristics for different reasons. For example, the characteristics of the memory cells NMC1 to NMCn according to each word line may vary with differences in distance between the common source line CSL and the memory cells. For example, a voltage transferred to the memory cell through the common source line CSL may vary with the distance between the common source line CSL and the corresponding memory cell.

The source selection transistor SST of each cell string may be connected between the common source line CSL and the source side dummy memory cell SDC. According to an embodiment, the common source line CSL may be coupled to the memory blocks BLK11 to BLK1z as shown in FIG. 14.

According to an embodiment, source selection transistors of cell strings arranged in the same row (+X direction) may be coupled to a source selection line extending in the row direction. Source selection transistors of cell strings arranged in different rows may be coupled to different source selection lines. Source selection transistors of the cell strings CS11 to CS1m arranged in the first row may be coupled to a first source selection line SSL1. Source selection transistors of the cell strings CS21 to CS2m arranged in the second row may be coupled to a second source selection line SSL2.

The source side dummy memory cell SDC of each cell string may be coupled between the source selection transistor SST and the memory cells NMC1 to NMCp. According to an embodiment, gates of the source side dummy memory cells located at the same height may be coupled to a single source side dummy word line SDWL.

The first to n-th memory cells NMC1 to NMCn of each cell string may be coupled between the source side dummy memory cell SDC and the drain side dummy memory cell DDC.

The first to n-th memory cells NMC1 to NMCn may be divided into first to pth memory cells NMC1 to NMCp and (p+1)th to nth memory cells NMCp+1 to NMCn. The first to pth memory cells NMC1 to NMCp and the (p+1)th to nth memory cells NMCp+1 to NMCn may be coupled through the pipe transistor PT.

The first to pth memory cells NMC1 to NMCp may be coupled in series between the source side dummy memory cell SDC and the pipe transistor PT. The (p+1)th to nth memory cells NMCp+1 to NMCn may be coupled in series between the pipe transistor PT and the drain side dummy memory cell DDC. Gates of the first to n-th memory cells NMC1 to NMCn may be coupled to first to n-th word lines NWL1 to NWLn, respectively.

A gate of the pipe transistor PT of each cell string may be coupled to a pipe line PL.

The drain side dummy memory cell DDC of each cell string may be coupled between the drain selection transistor DST and the memory cells NMCp+1 to NMCn. According to an embodiment, gates of drain side dummy memory cells located at the same height may be coupled to a single drain side dummy word line DDWL.

The drain selection transistor DST of each cell string may be coupled between the corresponding bit line and the drain side dummy memory cell DDC. Drain selection transistors of cell strings arranged in the same row may be coupled to a drain selection line extending in the row direction. Drain selection transistors of cell strings arranged in different rows may be coupled to different drain selection lines. Drain selection transistors of the cell strings CS11 to CS1m arranged in the first row may be coupled to a first drain selection line DSL1. Drain selection transistors of the cell strings CS21 to CS2m arranged in the second row may be coupled to a second drain selection line DSL2.

Cell strings arranged in the column direction (+Y direction) may be coupled to a bit line extending in the column direction. The cell strings CS11 and CS21 in the first column may be coupled to the first bit line BL1. The cell strings CS1$m$ and CS2$m$ in the mth column may be coupled to the mth bit line BLm. In other words, cell strings CS1$x$ and CS2$x$ in the xth column may be coupled to an xth bit line BLx, where x is greater than or equal to 1, and less than or equal to m.

Data may be stored in the first to n-th memory cells NMC1 to NMCn through the first to mth bit lines BL1 to BLm, respectively. The data stored in the first to n-th memory cells NMC1 to NMCn may be read through the first to mth bit lines BL1 to BLm. However, the data may not be stored in the dummy memory cells SDC and DDC.

Instead of the first to mth bit lines BL1 to BLm shown in FIG. 15, even bit lines and odd bit lines may be provided. Even cell strings, among the cell strings CS11 to CS1$m$ or CS21 to CS2$m$ arranged in the row direction, may be coupled to the even bit lines, respectively. Odd cell strings, among the cell strings CS11 to CS1$m$ or CS21 to CS2$m$ arranged in the row direction, may be coupled to the odd bit lines, respectively.

Figure 16:
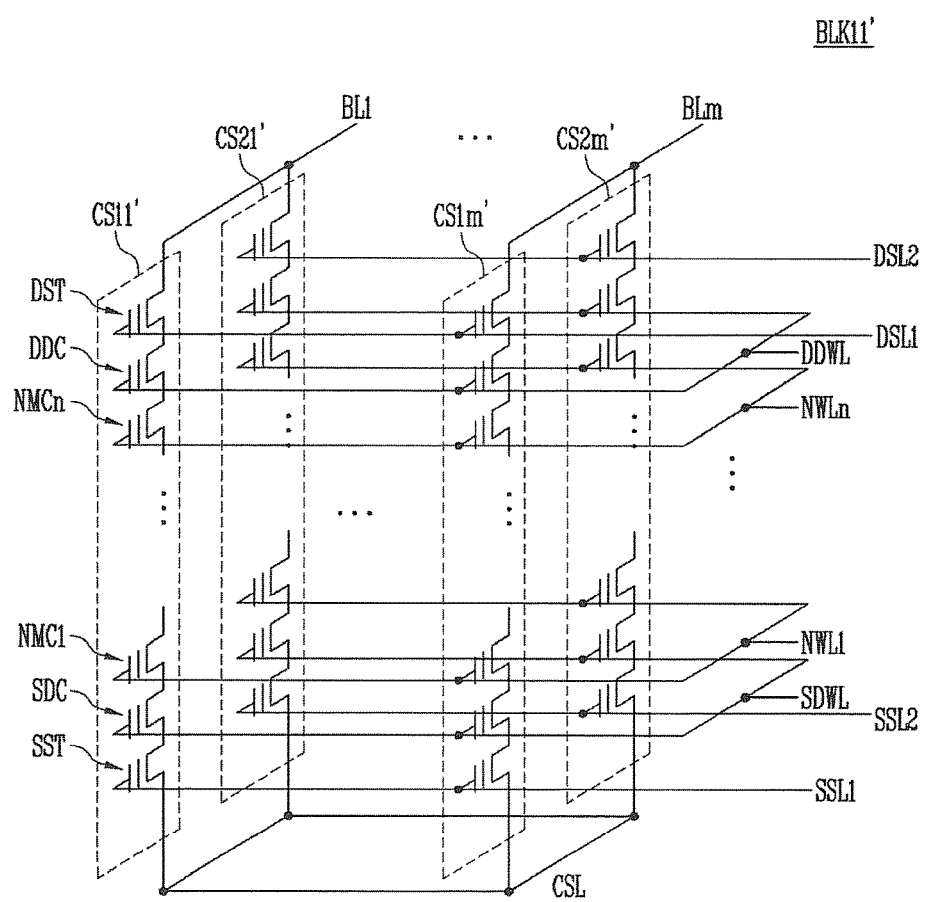
FIG. 16 is a circuit diagram illustrating another example of one of the memory blocks shown in FIG. 14.

FIG. 16 is a circuit diagram of another example of one (BLK11') of the memory blocks BLK11 to BLK1$z$ shown in FIG. 14.

Referring to FIG. 16, a first memory block BLK11' may include a plurality of cell strings CS11' to CS1$m$' and CS21' to CS2$m$'. Each of the cell strings CS11' to CS1$m$' and CS21' to CS2$m$' may extend in +Z direction. Each of the cell strings may include at least one source selection transistor SST, at least one source side dummy memory cell SDC, first to n-th memory cells NMC1 to NMCn, at least one drain side dummy memory cell DDC, and at least one drain selection transistor DST.

The selection transistors SST and DST, the dummy memory cells SDC and DDC and the memory cells NMC1 to NMCn may have similar structures. According to an embodiment, each of the selection transistors SST and DST, the dummy memory cells SDC and DDC and the memory cells NMC1 to NMCn may include a channel layer, a tunneling insulating layer, a charge storage layer and a blocking insulating layer.

In each cell string, the source selection transistor SST, the source side dummy memory cell SDC, the first to n-th memory cells NMC1 to NMCn, the drain side dummy memory cell DDC and the drain selection transistor DST may be sequentially stacked in a direction crossing a substrate (not illustrated) under the memory block BLK11', i.e., the +Z direction.

Holes may pass through structures, disposed between the bit lines BL1 to BLm and the substrate (not illustrated) under the memory block BLK11', in the opposite direction to the +Z direction. A channel layer may be formed in each hole. These holes may correspond to a single cell string. The channel layer formed in the hole may be provided as channel layers of the selection transistors SST and DST, the dummy memory cells SDC and DDC and the memory cells NMC1 to NMCn included in a single cell string.

Due to process characteristics, a width of each of the holes may decrease toward the substrate. For example, when the hole is formed by etching the structures of the memory block BLK11' from top toward the substrate, the width of each hole may gradually decrease toward the substrate. When the channel layer is formed in the hole, the channel layer corresponding to each of the memory cells NMC1 to NMCn of the cell string may have a diameter corresponding to the width of the hole.

The source selection transistor SST of each cell string may be coupled between the common source line CSL and the source side dummy memory cell SDC. The source of the source selection transistor SST may be coupled to the common source line CSL.

According to an embodiment, source selection transistors of cell strings arranged in the same row (+X direction) may be coupled to the same source selection line. Source selection transistors of cell strings arranged in different rows may be coupled to different source selection lines. Source selection transistors of the cell strings CS11' to CS1$m$' arranged in the first row may be coupled to the first source selection line SSL1. Source selection transistors of the cell strings CS21' to CS2$m$' arranged in the second row may be coupled to the second source selection line SSL2.

The source side dummy memory cell SDC of each cell string may be coupled between the source selection transistor SST and the memory cells NMC1 to NMCn. According to an embodiment, source side dummy memory cells located at the same height may be coupled to the same source side dummy word line SDWL.

In each cell string, the first to n-th memory cells NMC1 to NMCn may be coupled in series between the source side dummy memory cell SDC and the drain side dummy memory cell DDC. In the cell strings CS11' to CS1$m$' and CS21' to CS2$m$', memory cells located at the same height may be coupled to the same word line. The first to n-th memory cells NMC1 to NMCn may be coupled to the first to n-th word lines NWL1 to NWLn, respectively.

The drain side dummy memory cell DDC of each cell string may be coupled between the memory cells NMC1 to NMC and the drain selection transistor DST. According to an embodiment, drain side dummy memory cells located at the same height may be coupled to the drain side dummy word line DDWL.

The drain selection transistor DST of each cell string may be coupled between the corresponding bit line and the drain side dummy memory cell DDC. Drain selection transistors of the cell strings CS11' to CS1$m$' arranged in the first row may be coupled to the first drain selection line DSL1. Drain selection transistors of the cell strings CS21' to CS2$m$' arranged in the second row may be coupled to the second drain selection line DSL2.

As a result, except that the pipe transistor PT is removed from each cell string, the memory block BLK11' shown in FIG. 16 may have similar equivalent circuitry as the memory block BLK11 shown in FIG. 15.

Hereinafter, an embodiment of the present invention will be described using memory block BLK11 shown in FIG. 15 as a basis.

Figure 17:
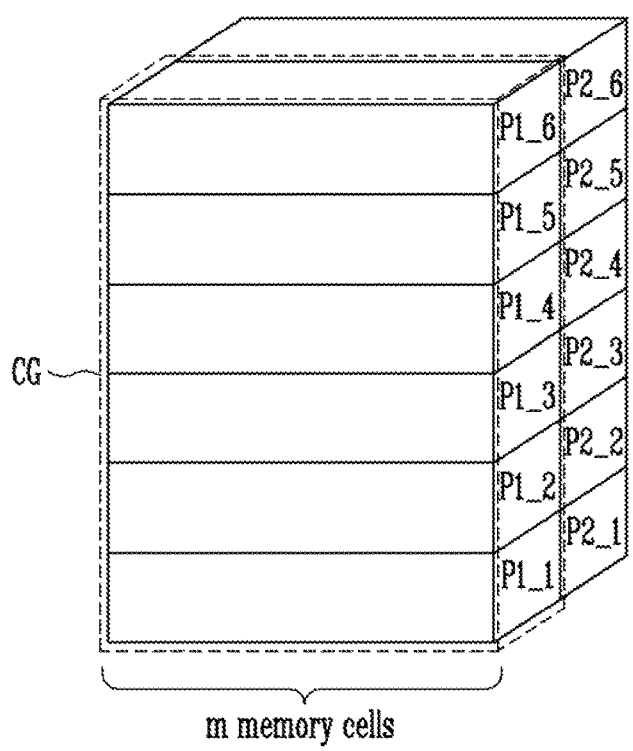
FIG. 17 is a schematic block diagram illustrating pages included in a memory block shown in FIG. 15.

FIG. 17 is a schematic block diagram of pages included in the memory block BLK11 shown in FIG. 15. In FIG. 17, it is assumed that each cell string includes six memory cells.

Referring to FIGS. 15 and 17, the memory block BLK11 may include a plurality of pages P1_1 to P1_6 and P2_1 to P2_6. For example, memory cells coupled to the same word line NWL1 in cell strings CS11 to CS1$m$ arranged in the same row (e.g., first row) may form a single page. In the memory block BLK11, m cell strings may be arranged in the row direction (i.e., +X direction). Therefore, a single page may include m memory cells.

Cell strings arranged in the same row may be included in a single cell string group CG. Since each of the cell strings includes six memory cells, a single cell string group CG may include six pages. The first to sixth pages P1_1 to P1_6 in the first row may form a first cell string group, and the first to sixth pages P2_1 to P2_6 in the second row may form a second cell string group.

Figure 18:
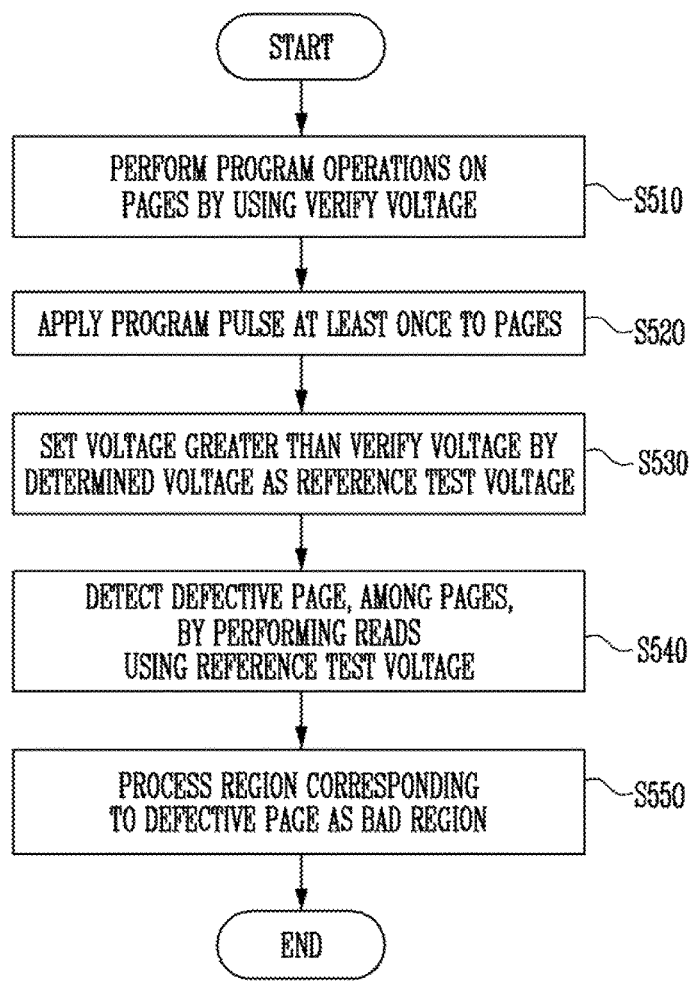
FIG. 18 is a flowchart illustrating a test operation of a semiconductor memory device according to another embodiment.

FIG. 18 is a flowchart illustrating the test operation of the semiconductor memory device 50 according to another embodiment.

Referring to FIGS. 2, 17 and 18, at step S510, the peripheral circuit 110 may perform program operations on the pages P1_1 to P1_6 and P2_1 to P2_6 of a selected memory block by using a verify voltage. Each of the program operations may be performed using an incremental step pulse program (ISPP) method. When the program operations are completed, memory cells of the pages P1_1 to P1_6 and P2_1 to P2_6 may have threshold voltages greater than the verify voltage.

Before the program operations, the threshold voltages of the memory cells of the selected memory block may be distributed within a relatively wide voltage range since the memory cells NMC1 to NMCn according to each word line have different characteristics. Prior to the program operations, it may be assumed that an erase operation is performed on the memory cells of the selected memory block. The erase operation may be performed in units of memory blocks. The erase operation may include reducing the threshold voltages of the memory cells by transferring an erase pulse to the channel layers of the cell strings and determining whether the threshold voltages of the memory cells are lower than an erase verify voltage Vev by applying the erase verify voltage Vev, which will be described with reference to FIG. 21, to the word lines. By repeating these operations, the threshold voltages of the memory cells may be reduced to less than the erase verify voltage Vev. These operations may be repeated until threshold voltages of all memory cells in the memory block become lower than the erase verify voltage Vev.

Since the memory cells NMC1 to NMCn according to each word line have different characteristics, voltage distributions of the pages P1_1 to P1_6 and P2_1 to P2_6 may have different voltage ranges. For example, memory cells of a word line adjacent to a substrate may be less affected by the erase pulse since channel layers thereof have a small length (diameter) and thus have a relatively small voltage distribution (see E4 in FIG. 21). For example, memory cells of a word line adjacent to the common source line CSL may be heavily affected by the erase pulse since channel layers thereof have a greater length (diameter) and thus have a relatively low voltage distribution (see E1 in FIG. 21).

A program operation may be performed on each page by using an ISPP method. The program operation may be performed in units of pages. A program may be repeated until threshold voltages of memory cells of each page are increased to be greater than the verify voltage. After the program operation, a voltage distribution of each page may be in a narrow voltage range higher than the verify voltage.

At step S520, the peripheral circuit 110 may apply a program pulse of high-voltage to pages at least once. The high-voltage program pulse generated by the voltage generator 130 may be applied to the word lines NWL1 to NWLn through the address decoder 120. Therefore, threshold voltages of the memory cells may be increased. The voltage distribution of each page may be increased. The voltage distribution of a page including slow cells may be slightly increased.

As a result, the page including the slow cells may have a different voltage distribution than other pages.

At step S530, a voltage greater than the verify voltage by a predetermined voltage may be set to the reference test voltage. The control logic 160 may control the voltage generator 130 to generate the reference test voltage.

At step S540, read operations may be performed on the pages PG1_1 to PG1_6 and PG2_1 to PG2_6 by using the reference test voltage to detect the defective page from the pages PG1_1 to PG1_6 and PG2_1 to PG2_6. The reference test voltage generated by the voltage generator 130 may be applied to each page through the address decoder 120 to perform each read operation thereon. It may be determined whether the defective page exists in the pages PG1_1 to PG1_6 and PG2_1 to PG2_6 on the basis of the read page data. While the read operations are sequentially performed on the first to sixth pages PG1_1 to PG1_6 in the first cell string group, it may be determined whether the defective page exists in the first to sixth pages PG1_1 to PG1_6. Whether the defective page exists in the first to sixth pages PG1_1 to PG1_6 may be determined using one of the methods described above according to the embodiments with reference to FIGS. 9, 10 and 12. Subsequently, while the read operations are sequentially performed on the first to sixth pages PG2_1 to PG2_6 in the second cell string group, it may be determined whether the defective page exists in the first to sixth pages PG2_1 to PG2_6. Whether the defective page exists in the first to sixth pages PG2_1 to PG2_6 may also be determined by one of the methods according to the embodiments described above with reference to FIGS. 9, 10 and 12.

At step S550, a region corresponding to the defective page may be processed as the bad region. According to an embodiment, the control logic 160 may define a memory block including the defective page as the bad region. The bad region may be replaced by a redundancy memory block, among the memory blocks BLK11 to BLK1z. According to an embodiment, the control logic 160 may define the defective page as the bad region. The bad region may be replaced by a redundancy page, among the pages included in the corresponding memory block.

According to an embodiment, after program operations are performed on the pages P1_1 to P1_6 and P2_1 to P2_6 of the selected memory block by using an ISPP method, the program pulse may be applied at least once to the pages P1_1 to P1_6 and P2_1 to P2_6. Therefore, the page including slow cells may have a different voltage distribution than other pages. Subsequently, the read operations may be performed on the pages P1_1 to P1_6 and P2_1 to P2_6 to detect the defective page. Therefore, the defective page may be efficiently detected. Accordingly, a semiconductor memory device 50 having improved reliability may be provided.

Figure 19:
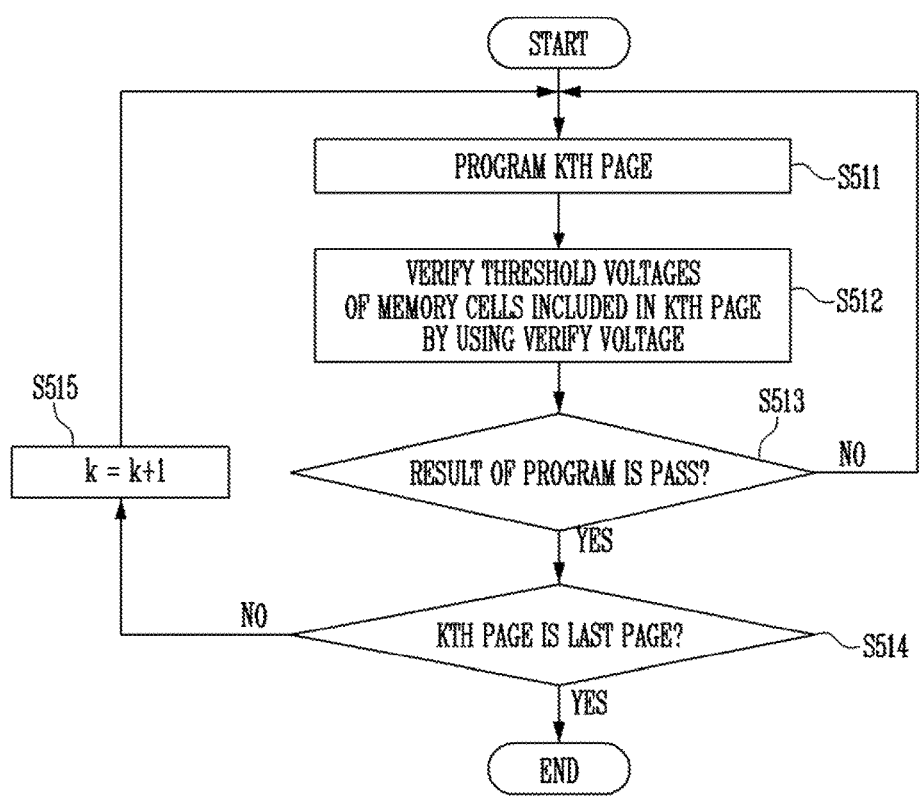
FIG. 19 is a flowchart illustrating program operations of pages of a single cell string group of a selected memory block.

FIG. 19 is a flowchart illustrating program operations of pages of a single cell string group CG of a selected memory block. FIG. 19 exemplarily shows the program operations on the pages P1_1 to P1_6 of the first cell string group of the selected memory block as described with reference to FIG. 17. Program operations on the pages P2_1 to P2_6 of the second cell string group may be the same as the pages P1_1 to P1_6 of the first cell string group.

Referring to FIGS. 15 and 19, at step S511, a program operation may be performed on a kth page among the pages P1_1 to P1_6, where k is an integer ranging from 1 to 6.

According to an embodiment, a turn-off voltage (e.g., ground voltage) may be applied to the source selection lines SSL1 and SSL2 of the selected memory block so that the cell strings CS11 to CS1m and CS21 to CS2m may be electrically separated from the common source line CSL. The turn-off voltage may be applied to an unselected drain selection line between the drain selection lines DSL1 and DSL2. Drain selection transistors coupled to the unselected drain selection line may be turned off, and the corresponding cell strings may be electrically separated from the bit lines BL1 to BLm. A turn-on voltage (e.g., power voltage) may be applied to a selected drain selection line between the drain selection lines DSL1 and DSL2. Therefore, cell strings coupled to the selected drain selection line may be selected cell strings. The selected cell strings may be cell strings including the kth page.

A program voltage having a high voltage level may be applied to a kth word line coupled to the kth page. Each of the memory cells of the kth page may be programmed or program-inhibited depending on data transferred through the corresponding bit line. When a program permission voltage (e.g., ground voltage) is applied to a bit line, the corresponding drain selection transistor may be turned on by a power voltage of the selected drain selection line and receive the program permission voltage from the bit line of the corresponding cell string. The program permission voltage may be transferred to the memory cell of the kth page. The difference between the program permission voltage and the program voltage of the kth word line may increase a threshold voltage of the memory cell of the kth page.

When a program inhibition voltage (e.g., power voltage) is applied to the bit line, even if a power voltage is applied to the selected drain selection line, the corresponding drain selection transistor may be turned off, and the corresponding cell string may be electrically separated from the bit line. In other words, the corresponding cell string may be separated from the bit line and the common source line and floated. When the program voltage is applied to the kth word line, the voltage of the channel layer of the corresponding cell string may be boosted. Since the difference between the boosted voltage of the channel layer and the program voltage is not large, the threshold voltage of the memory cell of the kth page may not increase.

The control logic 160 may control the page buffers PB1 to PBm to bias the bit lines BL1 to BLm to the program permission voltage, so that threshold voltages of the memory cells of the kth page may be increased during a program.

At step S512, the threshold voltages of the memory cells of the kth page may be verified using a verify voltage.

According to an embodiment, a turn-on voltage may be applied to a source selection line and a drain selection line corresponding to the selected cell strings. A turn-off voltage may be applied to a source selection line and a drain selection line corresponding to unselected cell strings. The selected cell strings may be electrically coupled to the bit lines BL1 to BLm and the common source line CSL. The unselected cell strings may be electrically separated from the bit lines BL1 to BLm and the common source line CSL.

A verify voltage may be applied to the kth word line. A pass voltage having a high voltage level may be applied to the remaining word lines. Memory cells coupled to the remaining word lines may be turned on regardless of threshold voltages thereof. The memory cells of the kth page may be turned on or off depending on threshold voltages thereof. The page buffers PB1 to PBm may verify the threshold voltages of the memory cells of the kth page by sensing voltages or currents of the bit lines BL1 to BLm. When the threshold voltages of the memory cells are less than or equal to the verify voltage, a logic value "1" may be read. When the threshold voltages of the memory cells are greater than the verify voltage, a logic value "0" may be read. The read page data may be stored in the page buffers PB1 to PBm. The page buffers PB1 to PBm may transfer the page data to the detector 170.

At step S513, it may be determined whether a program result is a pass or a not. The detector 170 may detect the number of data bits having the logic value "1" in the page data. The control logic 160 may determine that a result of the program is a fail when a data bit having the logic value "1" exits in the page data. If not, the control logic 160 may determine that the result of the program is a pass. When the program result is a fail, step S511 may be performed again. At step S511, among the page buffers PB1 to PBm, a page buffer which stores a data bit of the logic value "1" may bias the corresponding bit line to the program permission voltage. Among the page buffers PB1 to PBm, a page buffer which stores a data bit of the logic value "0" may bias the corresponding bit line to the program inhibition voltage. In other words, a memory cell having a threshold voltage less than or equal to the verify voltage may be programmed, and a memory cell having a higher threshold voltage than the verify voltage may be program-inhibited.

The program operation on the kth page may include steps S511 to S513. Since steps S511 to S513 are repeated until the program result is a pass, the threshold voltages of the memory cells of the kth page may be in a narrow voltage range higher than the verify voltage.

At step S514, it may be determined whether the kth page is the last page of the pages P1_1 to P1_6. If not, step S515 may be performed. In other words, a program operation may be performed on a subsequent page.

Figure 20:
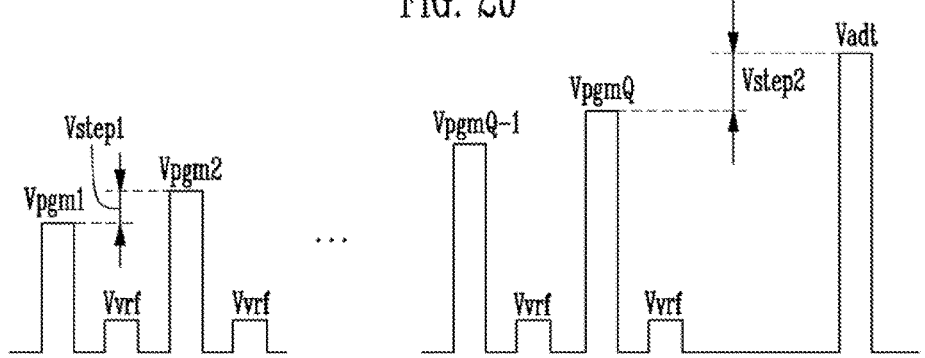
FIG. 20 is a voltage application diagram illustrating steps S510 and S220 in FIG. 18.

FIG. 20 is a voltage application diagram illustrating steps S510 and S520 described with reference to FIG. 18.

During a program operation, a program pulse may be repetitively applied to a word line of a selected page. First, the first program pulse Vpgm1 may be applied. During the corresponding verify, a verify voltage Vvrf may be applied to a word line of a selected page. When the program result is a fail, a second program pulse Vpgm2 greater than the first program pulse Vpgm1 by a first step voltage Vstep1 may be applied. During the corresponding verify, the verify voltage Vvrf may be applied. Until the program result is a pass, a plurality of incremental step pulses Vpgm1 to VpgmQ may be applied. Each of the program pulses Vpgm1 to VpgmQ may be higher than the previous program pulse by the first step voltage Vstep1. In other words, the program operation may be performed using an incremental step pulse program (ISPP) method.

It may be understood that the number of times the program pulses Vpgm1 to VpgmQ are applied may vary for each page. For example, when a program operation is performed on a page including slow cells, the program pulses Vpgm1 to VpgmQ may be applied a large number of times. However, the number of times the program pulses Vpgm1 to VpgmQ are applied may vary for each page including normal cells.

After program operations on the pages P1_1 to P1_6 and P2_1 to P2_6 of the selected memory block are completed, an additional program pulse Vadt may be applied. The additional program pulse Vadt may be greater than the highest program pulse VpgmQ, among the program pulses applied during the program operations on the pages P1_1 to P1_6 and P2_1 to P2_6, by a second step voltage Vstep2. According to an embodiment, the second step voltage Vstep2 may be higher than the first step voltage Vstep1. According to an embodiment, the second step voltage Vstep2 may be the same as the first step voltage Vstep1.

Figure 21:
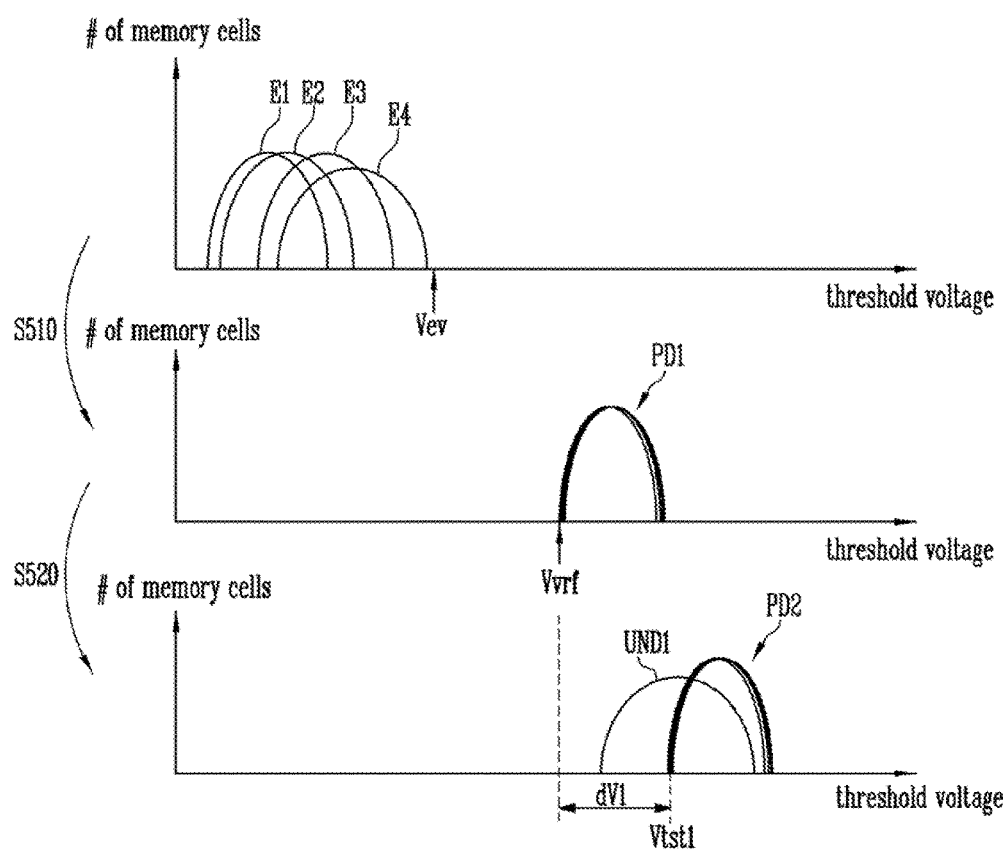
FIG. 21 is threshold voltage distributions illustrating an example of steps S510 and S520 in FIG. 18.

FIG. 21 is threshold voltage distributions illustrating an example of steps S510 and S520 described with reference to FIG. 18.

Referring to FIG. 21, before step S510 is performed, the pages P1_1 to P1_6 and P2_1 to P2_6 may have a plurality of erase distributions E1 to E4. The erase distributions E1 to E4 may vary depending on the characteristics of the memory cells NMC1 to NMCn for each word line. For convenience, FIG. 21 illustrates only four erase distributions E1 to E4. Some of the pages P1_1 to P1_6 and P2_1 to P2_6 may have the first erase distribution E1. Other pages of the pages P1_1 to P1_6 and P2_1 to P2_6 may have the second erase distribution E2. Yet other pages of the pages P1_1 to P1_6 and P2_1 to P2_6 may have the third erase distribution E3. The other pages of the pages P1_1 to P1_6 and P2_1 to P2_6 may have the fourth erase distribution E4. The erase distributions E1 to E4 may have lower voltage ranges than the erase verify voltage Vev.

When step S510 is performed, the pages P1_1 to P1_6 and P2_1 to P2_6 may have first voltage distributions PD1. The first voltage distributions PD1 may be in a narrow voltage range higher than the verify voltage Vvrf.

When step S520 is performed, the threshold voltages of the pages P1_1 to P1_6 and P2_1 to P2_6 may increase so that the pages P1_1 to P1_6 and P2_1 to P2_6 may have second voltage distributions PD2 or an abnormal voltage distribution UND1. Most of the pages may have similar voltage distributions PD2. On the other hand, a page including slow cells may have the abnormal voltage distribution UND1. For example, the corresponding word line may not normally transfer the program pulse. The memory cells of the corresponding word line may form a wide voltage range.

As shown in FIG. 21, the reference test voltage Vtst1 may be set around a left tail of the second voltage distributions PD2. The reference test voltage Vtst1 may be greater than the verify voltage Vvrf by a first voltage difference dV1. According to an embodiment, the first voltage difference dV1 may be the same as the second step voltage Vstep2 as shown in FIG. 20.

Subsequently, as described above in connection with step S540 in FIG. 18, read operations may be performed on the pages of the selected memory block by using the reference test voltage Vtst1. In each of these read operations, in page data or the comparative data (see FIGS. 10 and 13), a data bit having the logic value "1" may be defined as a fail bit, and a data bit having the logic value "0" may be defined as a pass bit. Therefore, at step S540, memory cells having threshold voltages which are not increased to a desired voltage level may be detected.

Figure 22:
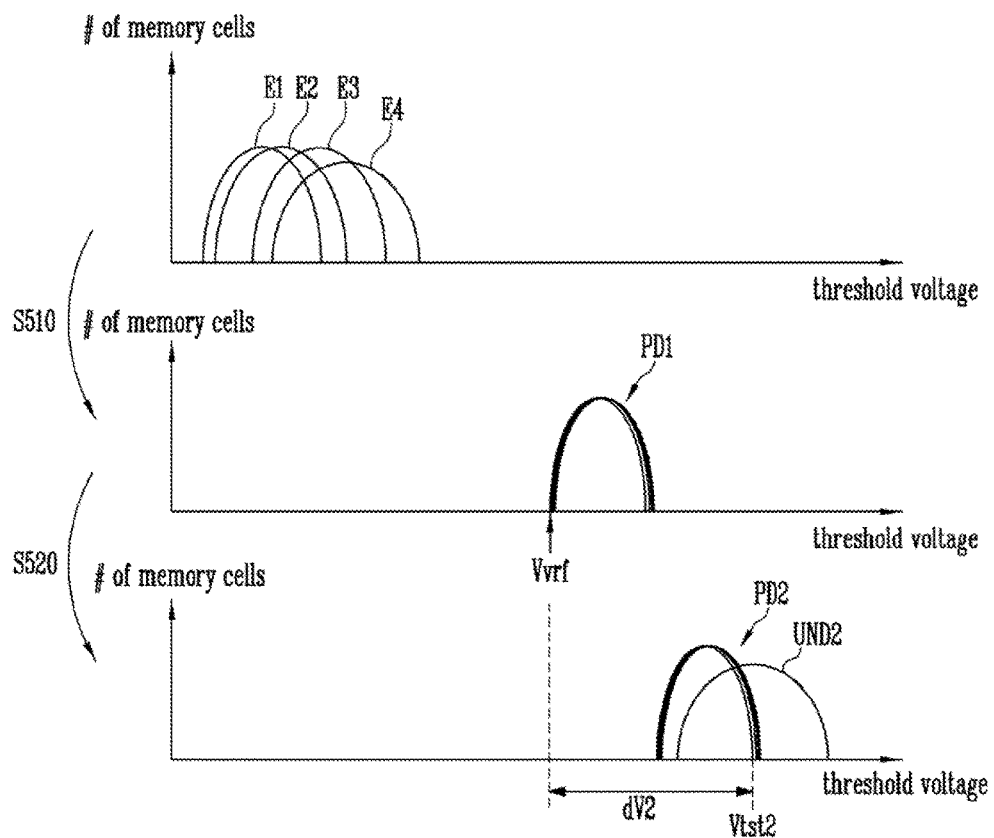
FIG. 22 is threshold voltage distributions illustrating another example of steps S510 and S520 in FIG. 18.

FIG. 22 is threshold voltage distributions illustrating another example steps S510 and S520 described with reference to FIG. 18.

Referring to FIG. 22, when step S510 is performed, the pages P1_1 to P1_6 and P2_1 to P2_6 may have the first voltage distributions PD1.

When step S520 is performed, the threshold voltages of the pages P1_1 to P1_6 and P2_1 to P2_6 may be increased.

Some pages may have the abnormal voltage distribution UND2 having a relatively high voltage level. The corresponding memory cells may be fast cells. The fast cells may have high threshold voltages although the same program pulse is applied. The abnormal voltage distribution UND2 may have a greater voltage range than the voltage distributions PD2 of normal pages. It may be understood that fast cells may appear due to various reasons. For example, because of errors during fabrication of the semiconductor memory device, memory cells may be affected by the program pulse.

The fast cells may deteriorate reliability of the semiconductor memory device. During a program operation, the fast cells may have increased threshold voltages even with only a few program pulses. The increased threshold voltages may reduce read margin.

A reference test voltage Vtst2 may be set to detect a page including the fast cells as the defective page. The reference test voltage Vtst2 may be greater than the verify voltage Vvrf by a second voltage difference dV2. The second voltage difference dV2 may be higher than the first voltage difference dV1.

Subsequently, as described above in connection with step S540 in FIG. 18, read operations may be performed on the pages of the selected memory block by using the reference test voltage Vtst2. In each of the read operations, in page data or the comparative data (see FIGS. 10 and 13), a data bit having the logic value "0" may be defined as a fail bit, and a data bit having the logic value "1" may be defined as a pass bit. Therefore, at step S540, the memory cells having excessively increased threshold voltage may be detected.

According to an embodiment, a reference test voltage may be set adaptively based on characteristics of pages of each memory block in a memory cell array. In addition, read operations may be performed using the reference test voltage to determine whether a defective page exists in a plurality of pages PB1 to PBm. Therefore, the defective page may be efficiently detected from the memory cell array. Accordingly, a semiconductor memory device having improved reliability may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A method of operating a semiconductor memory device including a plurality of pages coupled to a plurality of word lines, the method comprising:
   performing a program operation on each of the plurality of pages by using an incremental step pulse program (ISPP) method using a determined verify voltage;
   providing an additional program pulse at least once to the plurality of pages through the plurality of word lines; and
   detecting a defective page from the plurality of pages by performing read operations on the plurality of pages through a reference test voltage greater than the determined verify voltage.

2. The method of claim 1,
   wherein the plurality of pages are stacked over a substrate, and
   wherein each of the plurality of pages is coupled to a corresponding word line located at a predetermined height from the substrate.

3. The method of claim 1, wherein the detecting of the defective page comprises:
   detecting first and second page data by performing read operations on first and second pages, respectively, among the plurality of pages;
   generating a first comparative page by performing an OR operation on data bits of the first and second page data; and
   generating a first error value according to a number of fail bits of the first comparative page.

4. The method of claim 3, wherein the detecting of the defective page further comprises:

detecting third page data by performing a read operation on a third page among the plurality of pages;

generating a second comparative page by performing an OR operation on the data bits of the second and third page data;

generating a second error value according to a number of fail bits of the second comparative page; and detecting the third page as the defective page by comparing the second error value with the first error value.

5. The method of claim 1, wherein the detecting of the defective page comprises:

detecting first page data by performing a read operation on a first page among the plurality of pages;

generating a first error value according to a number of fail bits in the first page data;

detecting second page data by performing a read operation on a second page among the plurality of pages;

generating a second error value according to a number of fail bits in the second page data; and detecting the second page as the defective page by comparing the second error value with the first error value.

6. The method of claim 1, wherein the detecting of the defective page comprises:

detecting page data by performing a read operation on one of the plurality of pages; and detecting a corresponding page as the defective page when a number of fail bits in the page data is greater than a reference value.

7. The method of claim 1, wherein a region corresponding to the defective page is defined as a bad region.

8. A semiconductor memory device, comprising:

a memory cell array including a plurality of memory blocks, each of which includes a plurality of pages coupled to each of the plurality of word lines; and a peripheral circuit suitable for performing a program operation on each of the plurality of pages, wherein during the program operation, the peripheral circuit performs the program operation on a selected page, verifies whether or not a result of the program operation is a pass by applying a verify voltage to a word line of the selected page, and repeats programming and verifying until the result of the program operation is the pass, and wherein the peripheral circuit further increases threshold voltages of memory cells included in the plurality of pages by applying an additional program pulse at least once to the plurality of word lines, and detects a defective page among the plurality of pages by performing read operations on the plurality of pages through a reference test voltage greater than the verify voltage by an amount of a determined voltage.

9. The semiconductor memory device of claim 8, wherein the plurality of pages are stacked over a substrate, and wherein each of the plurality of pages is coupled to a corresponding word line located at a predetermined height from the substrate.

10. The semiconductor memory device of claim 8, wherein the peripheral circuit detects the defective page by:

detecting first and second page data by performing read operations on first and second pages, respectively, among the plurality of pages, generating a first comparative page by performing an OR operation on data bits of the first and second page data, detecting third page data by performing a read operation on a third page among the plurality of pages, and generating a second comparative page by performing an OR operation on data bits of the second and third page data.

11. The semiconductor memory device of claim 10, wherein the peripheral circuit comprises:

a detector suitable for generating a first error value according to a number of fail bits of the first comparative page and a second error value according to a number of fail bits of the second comparative page; and a control logic suitable for detecting the third page as the defective page by comparing the second error value with the first error value.

12. The semiconductor memory device of claim 8, wherein a region corresponding to the defective page is defined as a bad region.

* * * * *